US006901026B2

United States Patent
Takeuchi et al.

(12) 
(10) Patent No.: US 6,901,026 B2
(45) Date of Patent: May 31, 2005

(54) SEMICONDUCTOR INTEGRATED CIRCUIT EQUIPMENT WITH ASYNCHRONOUS OPERATION

(75) Inventors: Yoshiaki Takeuchi, Yokohama (JP); Shinichiro Shiratake, Yokohama (JP); Kohei Oikawa, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 47 days.

(21) Appl. No.: 10/366,418

(22) Filed: Feb. 14, 2003

(65) Prior Publication Data

US 2003/0156489 A1 Aug. 21, 2003

(30) Foreign Application Priority Data

Feb. 18, 2002 (JP) .................................. 2002-040419
Nov. 27, 2002 (JP) .................................. 2002-344049

(51) Int. Cl.[7] .............................................. G11C 8/00
(52) U.S. Cl. ..................... 365/233.5; 365/145; 365/195
(58) Field of Search ............................. 365/233.5, 145, 365/195

(56) References Cited

U.S. PATENT DOCUMENTS

| | | | | |
|---|---|---|---|---|
| 5,488,587 A | * | 1/1996 | Fukumoto | ................... 365/222 |
| 5,646,902 A | | 7/1997 | Park | |
| 5,672,989 A | * | 9/1997 | Jang et al. | ................... 327/143 |
| 5,748,558 A | | 5/1998 | Suzuki | |
| 6,385,078 B2 | * | 5/2002 | Jeon | ........................... 365/145 |
| 6,396,758 B2 | * | 5/2002 | Ikeda et al. | ................. 365/222 |
| 6,545,924 B2 | * | 4/2003 | Fujieda et al. | ............. 365/222 |
| 6,577,550 B2 | * | 6/2003 | Ito | ............................. 365/222 |

FOREIGN PATENT DOCUMENTS

JP 2001-357671 12/2001

* cited by examiner

*Primary Examiner*—Hoai Ho
(74) *Attorney, Agent, or Firm*—Oblon, Spivak, McClelland, Maier & Neustadt, P.C.

(57) ABSTRACT

A semiconductor integrated circuit device includes a memory, /CE transition detector, address transition detector, /WE transition detector and controller. The controller includes a timeout circuit. The timeout circuit generates an internal circuit control signal with preset width to control access to the memory based on detection results of the above transition detectors. The operation of the memory is controlled by the timeout circuit at the read time. The operation of the memory is controlled by the timeout circuit when transition of the end of a /WE signal is detected by the /WE transition detector before a timing specified by the timeout circuit at the write time. Further, the operation of the memory is controlled in response to the transition of the /WE signal when the transition of the end of the /WE signal is detected by the /WE transition detector after passage of the above timing.

26 Claims, 20 Drawing Sheets

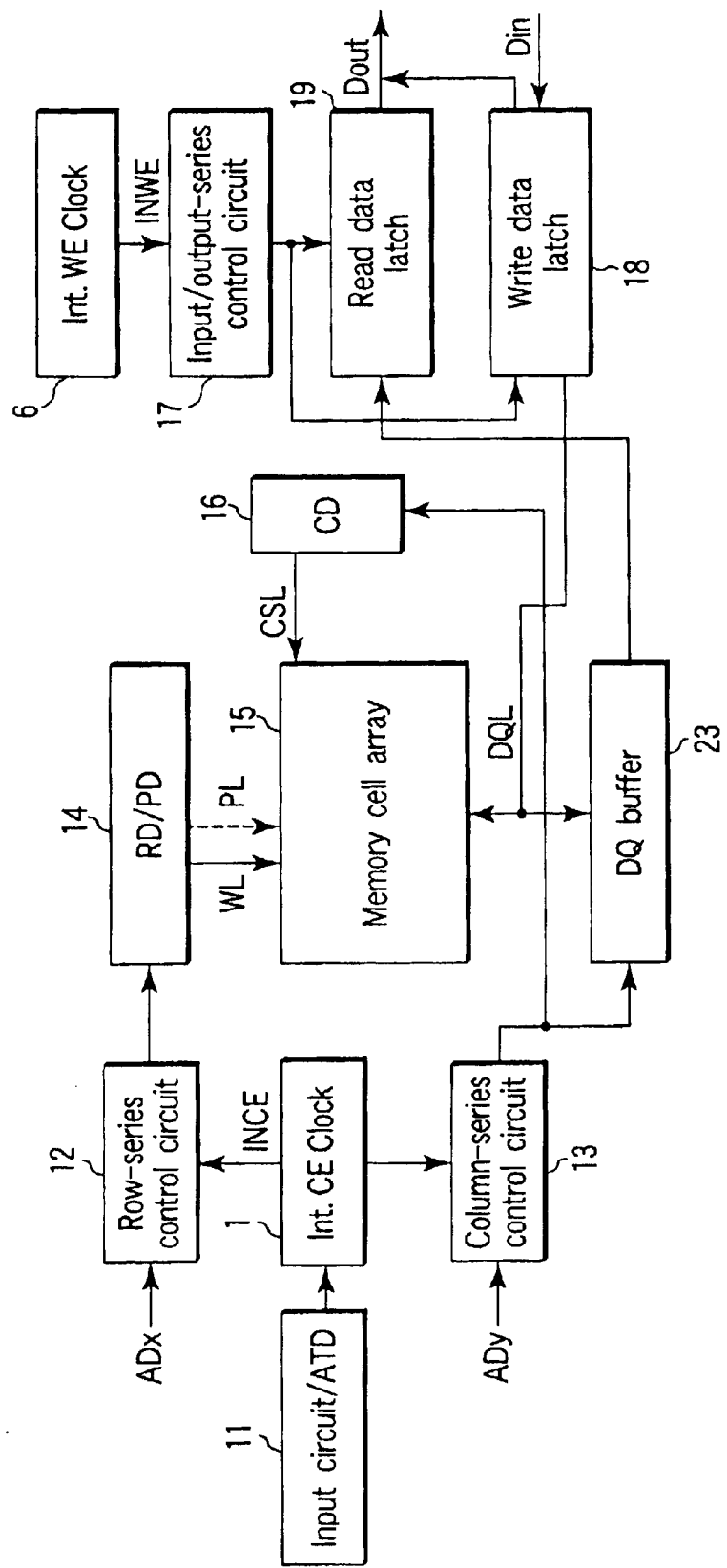
F I G. 4

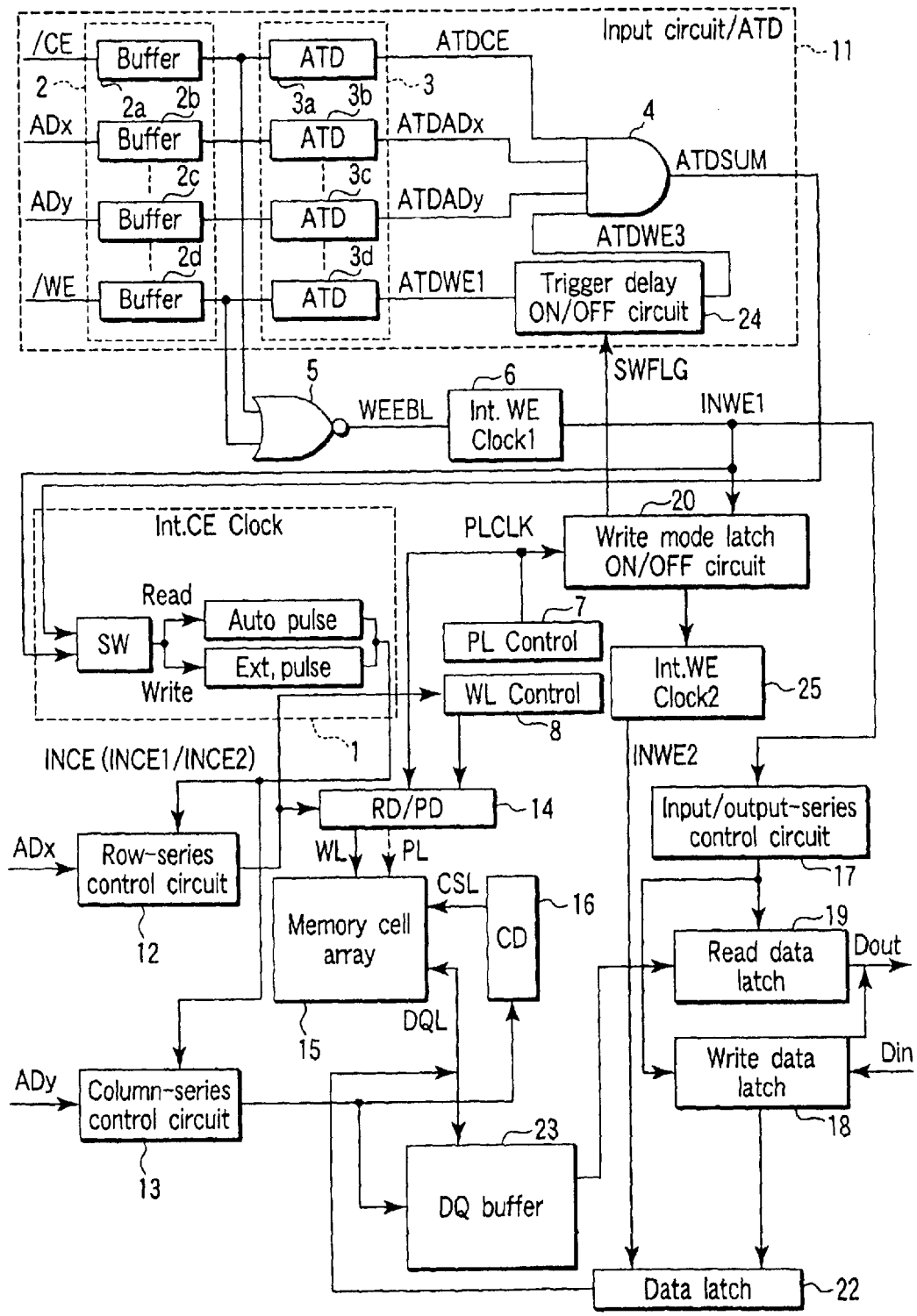
F I G. 13

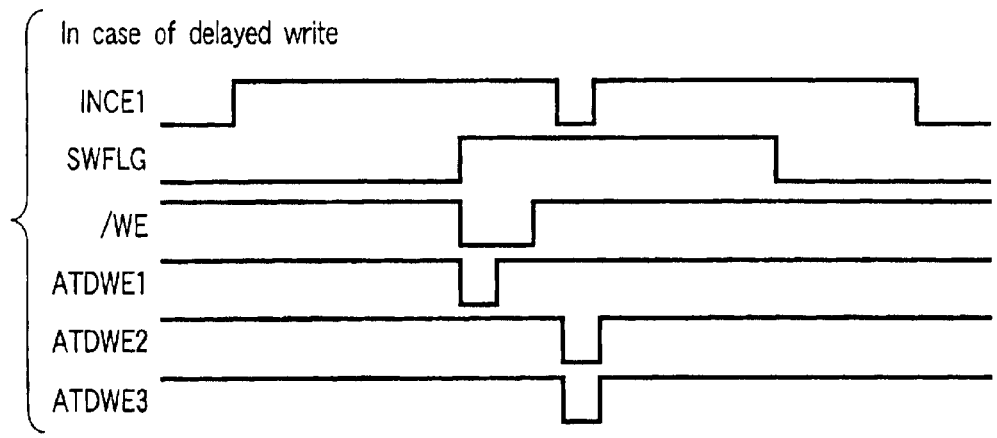
F I G. 19A
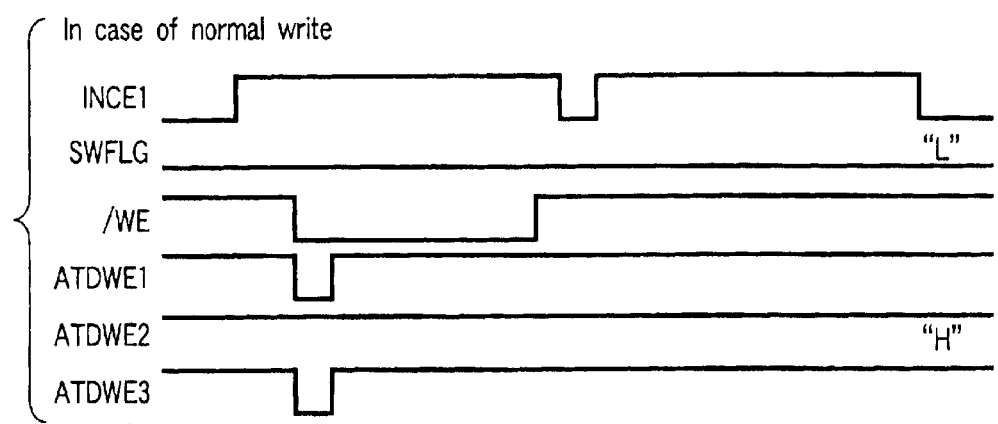
F I G. 19B

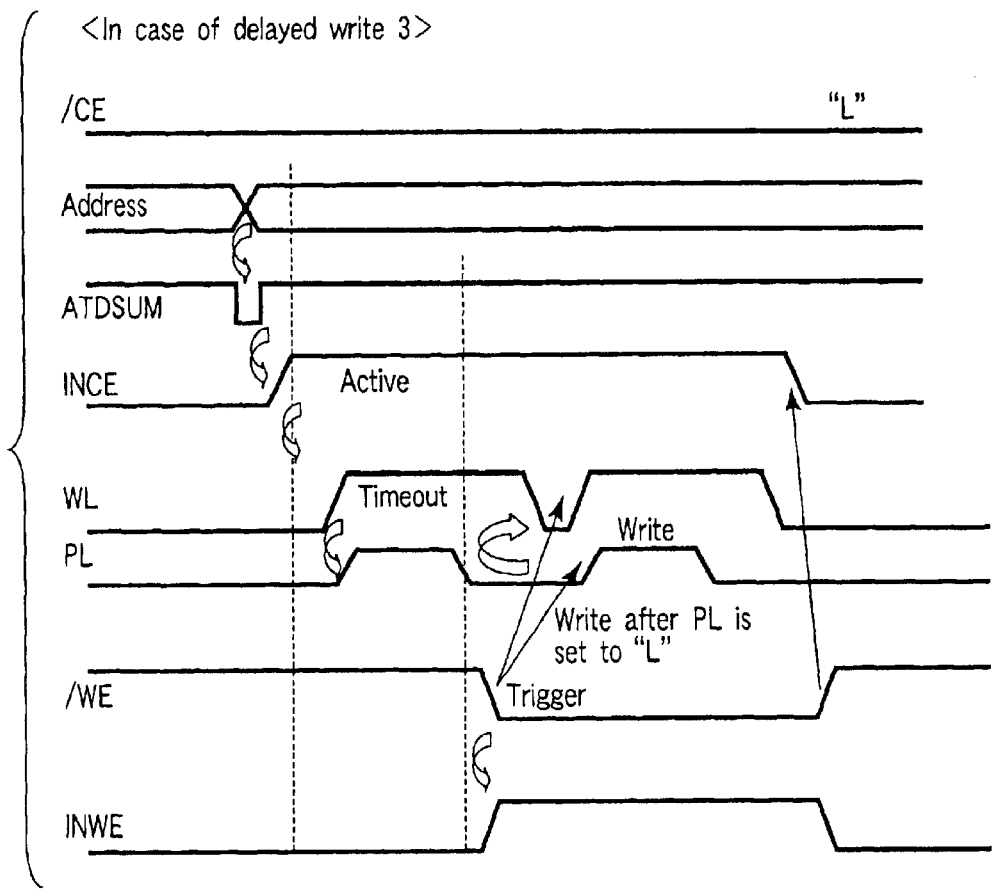
F I G. 21

SEMICONDUCTOR INTEGRATED CIRCUIT EQUIPMENT WITH ASYNCHRONOUS OPERATION

CROSS-REFERENCE TO RELATED APPLICATIONS

This application is based upon and claims the benefit of priority from the prior Japanese Patent Applications No. 2002-040419, filed Feb. 18, 2002; and No. 2002-344049, filed Nov. 27, 2002, the entire contents of both of which are incorporated herein by reference.

BACKGROUND OF THE INVENTION

1. Field of the Invention

This invention relates to a semiconductor integrated circuit device and more particularly to a semiconductor integrated circuit device on which an asynchronous interface like SRAM (Static Random Access Memory) using a ferroelectric memory, DRAM (Dynamic Random Access Memory), etc., in a memory core section is mounted.

2. Description of the Related Art

In order to enhance the integration density while application compatibility with an existing SRAM is maintained, a pseudo-SRAM using a ferroelectric memory or DRAM in a memory core section is commercialized. Among the conventional pseudo-SRAMs, a synchronous type SRAM in which the operation of an internal circuit is controlled by use of a clock signal generated in a time series fashion in the internal portion of the device according to an external input signal, for example, an external chip enable signal /CE is dominant.

In recent years, the demand for pseudo-SRAMs used to form portable telephones (cellular system) becomes stronger. In the pseudo-SRAMs used to form portable telephones, the demand for an asynchronous type pseudo-SRAM which can be operated even asynchronously with respect to an external input signal is strong.

In order to realize an asynchronous type pseudo-SRAM, the operation as shown by a timing chart of FIGS. 1A and 1B is required. FIG. 1A shows a read operation and FIG. 1B shows a write operation.

In order to realize the read operation and write operation as shown in FIGS. 1A and 1B, the following configuration can be considered. That is, a plurality of ATD circuits (Address Transition Detecting circuits) which detect the transition of an address are provided and the address transition is detected by use of the ATD circuits. An internal chip enable signal INCE which controls the internal circuit is generated based on a logical product signal ATDSUM obtained as the result of detection. Signals used to drive word lines WL and plate lines PL are generated based on the internal chip enable signal INCE in a time series fashion so as to control the operation of the internal circuit.

In this case, cycle time which is defined by the external input signals (which are the external chip enable signal /CE and address signal) is freely set. However, since the internal chip enable signal INCE formed by use of a timeout circuit (time is constant) is used to control the internal operation, the cycle time becomes constant.

With the above configuration, no problem occurs in the case of the read operation, but a limitation is put on the write operation. The limitation is explained in detail below. As shown in the timing chart of FIG. 1B, the write operation is performed when the external chip enable signal /CE is set at the "L" level and the external write enable signal /WE is set at the "L" level. However, for example, in the case of a pseudo-SRAM having a memory core section configured by use of a ferroelectric memory, data can be written into a cell only in a period during which a plate line PL is being pulse-driven after a word line WL is selected.

As a result, even if the write operation is performed in a period other than the period defined by the above condition, no data can be written into the cell. Therefore, it is necessary to write data after the external write enable signal /WE is set at the "L" level in the write possible period.

Thus, with the conventional configuration in which the signal used to control the operation of the internal circuit is generated by use of the timeout circuit, since the cycle time of the internal circuit is determined constant, the degree of freedom of the write operation is lowered and the operability by the user may be lowered.

Further, as one method of the write operation, a delayed write (or late write) method is known (for example, refer to U.S. Pat. No. 5,748,558). In the delayed write method, only the operation for fetching a given write address and write data into the internal portion of the semiconductor memory device is performed in an operation cycle in which a write request is given from the exterior and the write address and write data are kept held in the internal portion until a write request is next input. Then, the actual write operation into a memory cell is not performed in the present operation cycle, but performed in an operation cycle in which a next write request is input. That is, the method is to delay the write operation with respect to the memory cell to an operation cycle in which a next write request is input.

The delayed write method is considered to attain high speed access to a synchronous type or asynchronous type semiconductor memory device. It is used in a semiconductor memory device having a special high-speed specification such as a synchronous specification. Particularly, in the case of a memory core such as an SRAM which performs non-destructive reading, since it is only required to perform the operation of reading out or rewriting data latched in a cell, the method can be easily applied.

FIG. 2 is a timing chart for illustrating the operation of a semiconductor memory device in which the above delayed write method is used. The write operation is started when the external chip enable signal /CE is set to the "L" level and the external write enable signal /WE is set to the "L" level. In the write operation, an address "A-1" which is used for the write process into a memory cell array and write data "D-1" on an I/O line corresponding to the address "A-1" are supplied to and held in a data register.

Next, when the external write enable signal /WE is set to the "H" level, a word line WL corresponding to an address A0 of the memory cell array is driven and data is read out and supplied onto the bit line. The data read out onto the bit line is amplified by a sense amplifier and then output onto the I/O line as read data Q0.

After this, when the external write enable signal /WE is set to the "L" level, the write operation is performed by use of the address "A-1" and write data "D-1" held in the data register by the write operation which is performed one cycle before the present cycle. That is, a word line WL corresponding to the address "A-1" of the memory cell array is driven and write data "D-1" is read out onto the bit line via the sense amplifier. Thus, the operation of writing data into the memory cell is performed.

After the end of the write operation, an address A1 to be written in the present cycle and write data D1 on an I/O line corresponding to the address A1 are supplied to and held in the data register.

After this, the read operation and write operation which are similar to those described above are alternately performed.

However, with the above method, average read/write access time can be shortened, but the write operation is delayed by at least one cycle. Since the write operation is not performed until a write request is input if the read operations are successively performed, there occurs a possibility that write data cannot be written. This is because it is necessary to execute (n+1) write operation cycles without fail in order to perform n write operations.

Therefore, in a semiconductor memory device of synchronous specification, a period (dead cycle) in which no operation is performed is inserted between the read cycle and the write cycle without fail. As a result, a limitation is imposed on the application method and it is not versatile.

Further, a semiconductor memory device in which the above delayed write method is applied to a pseudo-SRAM using a DRAM core is also known (for example, refer to Jpn. Pat. Appln. KOKAI Publication No. P2001-357671). However, in the case of a memory core such as a DRAM or ferroelectric memory in which destructive reading is performed, it is necessary to provide time (which is generally referred to as precharge time) required for rewriting cell data after the read (write) operation. In addition, it takes a certain time after the access operation is started until a state in which data can actually be written into the cell is set. Further, since the DRAM is a volatile memory, the refresh operation is also required.

Therefore, since vacant time in which no operation is performed is not provided in one cycle, the delayed write method cannot effectively exhibit the effect in a device other than the device corresponding to a special specification such as the synchronous specification. Further, even if the delayed write method is used, the limitation that the write possible time is only a period during which a plate line PL is being pulse-driven after a word line WL is selected is not reduced or removed in the case of a pseudo-SRAM having a memory core section configured by a ferroelectirc memory, for example, in a system using the timeout circuit to control the internal operation as described above. That is, data can be written into the cell only in a period during which the plate line PL is being pulse-driven after the word line WL is selected.

As described above, when the delayed write method is used, the degree of freedom of the write operation in the pseudo-SRAM using a DRAM or ferroelectirc memory is lowered and the operability by the user is lowered.

Further, as described above, with the conventional semiconductor integrated circuit device having the pseudo-SRAM mounted thereon, there occurs a problem that the limitation is imposed on the write operation and the operability thereof by the user is lowered if the asynchronous operation is performed.

BRIEF SUMMARY OF THE INVENTION

A semiconductor integrated circuit device according to an aspect of the present invention includes a memory cell array, a chip enable transition detecting circuit which detects transition of a chip enable signal which specifies start of an operation of the memory cell array, an address transition detecting circuit which detects transition of a row address signal which specifies a row address of the memory cell array and transition of a column address signal which specifies a column address thereof, a write enable transition detecting circuit which detects transition of a write enable signal which specifies a write operation of the memory cell array, a first logic circuit which derives a logical product of results of detection by the chip enable transition detecting circuit, the address transition detecting circuit, and the write enable transition detecting circuit, a second logic circuit which outputs a signal to start the write operation based on the chip enable signal and the write enable signal, a first internal control circuit which is controlled ay an output signal of the first logic circuit to generate an internal chip enable signal, a second internal control circuit which is controlled by an output signal of the second logic circuit to generate an internal write enable signal, a plate-line control circuit, into which the internal chip enable signal generated by the first internal control circuit is input, a word-line control circuit, into which the internal chip enable signal generated by the first internal control circuit, a first read/write control and selection circuit, into which an output signal of the plate-line control circuit is input, which is controlled by the internal write enable signal output from the second internal control circuit, and which drives plate lines, the first read/write control and selection circuit including (i) a first timeout circuit, which generates a first internal circuit control signal with preset width to control access to the memory cell array based on the internal write enable signal, and (ii) a first pulse generator which outputs a first pulse signal in response to the transition of the write enable signal input from the exterior at the time of the write operation, based on the internal write enable signal, and a second read/write control and selection circuit, into which an output signal of the word-line control circuit is input, which is controlled by the internal write enable signal output from the second internal control circuit, and which drives word lines, the second read/write control and selection circuit including (i) a second timeout circuit, which generates a second internal circuit control signal with preset width to control access to the memory cell array based on the internal write enable signal, and (ii) a second pulse generator, which outputs a second pulse signal in response to the transition of the write enable signal at the time of the write operation, based on the internal write enable signal, wherein the operation of the memory cell array is controlled by use of the first and second timeout circuits at the time of the read operation with respect to the memory cell array, the operation of the memory cell array is controlled by use of the first and second timeout circuits when transition of an end of the write enable signal is detected by the write enable transition detecting circuit before a timing specified by the first and second timeout circuits is terminated at the time of the write operation with respect to the memory cell array, and the operation of the memory cell array is controlled by control by the first and second pulse generators when transition of the end of the write enable signal is detected by the write enable transition detecting circuit after the timing specified by the first and second timeout circuits has elapsed at the time of the write operation with respect to the memory cell array.

A semiconductor integrated circuit device according to another aspect of the present invention includes a memory cell array, a chip enable transition detecting circuit which detects transition of a chip enable signal which specifies start of an operation of the memory cell array, an address transition detecting circuit which detects transition of a row address signal which specifies a row address of the memory cell array and transition of a column address signal which specifies a column address thereof, a write enable transition detecting circuit which detects transition of a write enable signal which specifies a write operation of the memory cell array, a first logic circuit which derives a logical product of results of detection by the chip enable transition detecting circuit, the address transition detecting circuit, and the write enable transition detecting circuit, a second logic circuit which outputs a signal to start the write operation based on the chip enable signal and the write enable signal, a first internal control circuit which is controlled by an output signal of the second logic circuit to generate an internal chip enable signal, a second internal control circuit, which is supplied with an internal write enable signal generated in the first internal control circuit and an output signal of the first logic circuit, and which generates an internal chip enable signal, the second internal control circuit including (i) a switch which selects either one of the internal write enable signal and the output signal of the first logic circuit, (ii) a timeout circuit which outputs a pulse signal with preset width from the signal selected by the switch, and (iii) a pulse generator which generates a pulse signal in response to the transition of the write enable signal selected from the signal selected by the switch at the time of the write operation, a plate-line control circuit, into which the internal chip enable signal output from the second internal control circuit is input, and which drives plate lines, and a word-line control circuit, into which the internal chip enable signal output from the second internal control circuit is input, and which drives word lines, wherein the operation of the memory cell array is controlled by use of the timeout circuit at the time of the read operation with respect to the memory cell array, the operation of the memory cell array is controlled by use of the timeout circuit when transition of an end of the write enable signal is detected by the write enable transition detecting circuit before a timing specified by the timeout circuit is terminated at the time of the write operation with respect to the memory cell array, and the operation of the memory cell array is controlled by the pulse generator when transition of the end of the write enable signal is detected by the write enable transition detecting circuit after the timing specified by the timeout circuit has elapsed at the time of the write operation with respect to the memory cell array.

BRIEF DESCRIPTION OF THE SEVERAL VIEWS OF THE DRAWING

FIG. 4 is a block diagram showing the schematic configuration of the pseudo-SRAM formed in the semiconductor integrated circuit device, for illustrating the semiconductor integrated circuit device according to the first embodiment of the present invention;

FIG. 13 is a block diagram showing an example of the detail configuration of the extracted main portion of a pseudo-SRAM, for illustrating a semiconductor integrated circuit device according to a third embodiment of the present invention;

FIG. 19A is a timing chart showing the delayed write operation to illustrate the operation of the trigger delay ON/OFF circuit shown in FIG. 13, for illustrating the semiconductor integrated circuit device according to the third embodiment of the present invention;

FIG. 19B is a timing chart showing the normal write operation to illustrate the operation of the trigger delay ON/OFF circuit shown in FIG. 13, for illustrating the semiconductor integrated circuit device according to the third embodiment of the present invention;

FIG. 21 is a timing chart for illustrating the operation of a semiconductor integrated circuit device according to a fifth embodiment of the present invention;

DETAILED DESCRIPTION OF THE INVENTION

[First Embodiment]

Figure 3:
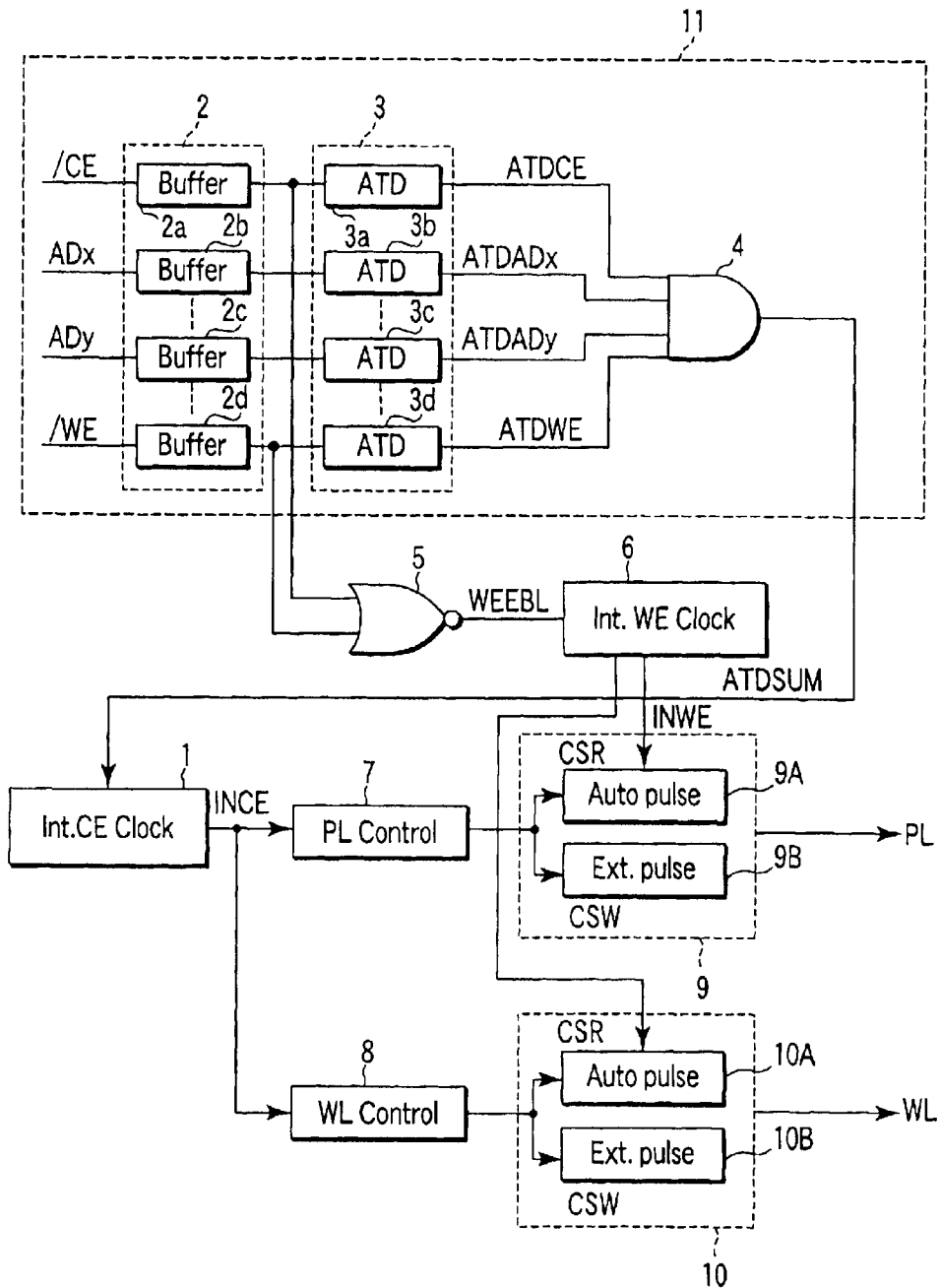
FIG. 3 is a block diagram showing an example of the configuration of the extracted main portion of a pseudo-SRAM formed in a semiconductor integrated circuit device, for illustrating the semiconductor integrated circuit device according to a first embodiment of the present invention.
Figures 5A, 5B:
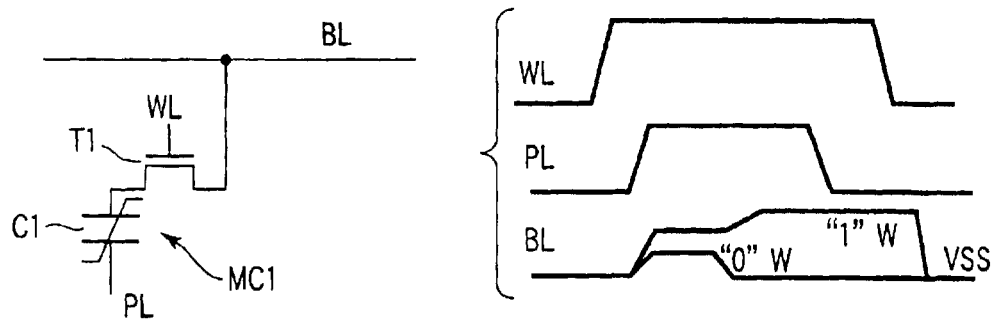
FIG. 5A is an equivalent circuit diagram of a ferroelectric cell having a one-transistor/one-capacitor structure, for illustrating the example of the configuration of the memory cell array shown in FIG. 4.
FIG. 5B is a timing chart showing the operation waveforms of the memory cell array, for illustrating the example of the configuration of the memory cell array shown in FIG. 4.
Figure 6:
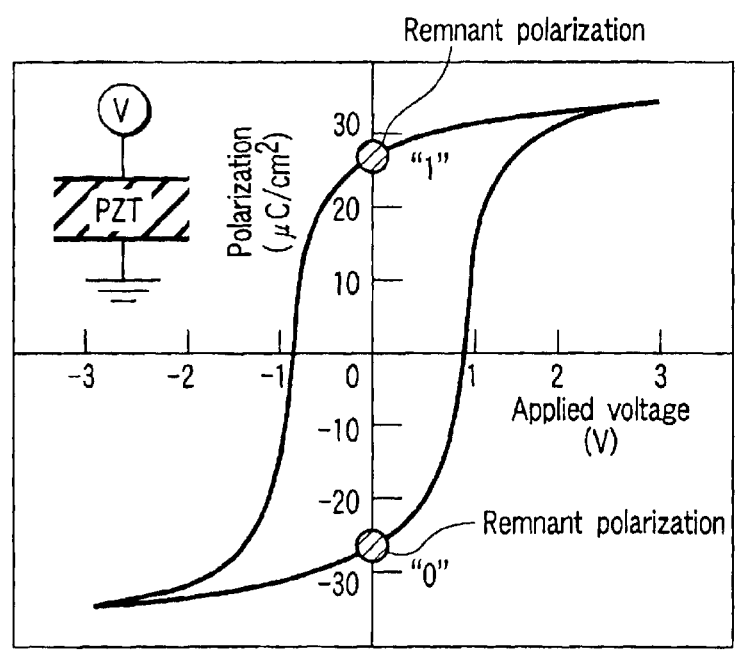
FIG. 6 is a characteristic diagram showing the relation (hysteresis characteristic) between the remnant polarization and application voltage of the ferroelectric capacitor shown in FIG. 5A.

FIGS. 3, 4, 5A, 5B, 6, 7A, 7B, 8A and 8B illustrate a semiconductor integrated circuit device according to a first embodiment of the present invention. FIG. 4 is a schematic configuration diagram showing the portion of a pseudo-SRAM formed in the semiconductor integrated circuit device and FIG. 3 shows an example of the detail configuration of the main portion thereof. Further, FIGS. 5A and 5B respectively show the equivalent circuit and operation waveforms of a memory cell in the memory cell array shown in FIG. 4, for illustrating an example of the configuration of the memory cell. FIG. 6 shows an example of the relation (hysteresis characteristic) between the remnant polarization and application voltage of a ferroelectric capacitor shown in FIG. 5A. FIGS. 7A, 7B, 8A and 8B are timing charts respectively showing the operation waveforms of the pseudo-SRAM shown in FIGS. 3, 4, 5A and 5B.

As shown in FIG. 4, the pseudo-SRAM includes an input circuit and ATD circuit (input circuit/ATD) 11, row-series control circuit 12, column-series control circuit 13, row decoder and plate decoder (RD/PD) 14, memory cell array 15, column decoder (CD) 16, input-series control circuit 17, write data latch 18, read data latch 19, DQ buffer 23, internal CE control circuit (Int. CE Clock) 1 and internal WE control circuit (Int. WE Clock) 6.

The row-series control circuit 12 is supplied with a row address signal ADx and the column-series control circuit 13 is supplied with a column address signal ADy. The row-series control circuit 12 and column-series control circuit 13 are controlled by an internal chip enable signal INCE output from the internal CE control circuit 1. An output signal of the input circuit and ATD circuit 11 is supplied to the internal CE control circuit 1.

An output signal of the row-series control circuit 12 is supplied to the row decoder and plate decoder 14 and a word line WL and plate line PL in the memory cell array 15 are selected and driven by the row decoder and plate decoder 14. An output signal of the column-series control circuit 13 is supplied to the column decoder 16 and a column selection line CSL in the memory cell array 15 is selected by the column decoder 16. Further, the output signal of the column-series control circuit 13 is also supplied to the DQ buffer 23.

Write data Din to be written into a selected cell in the memory cell array 15 is latched by the write data latch 18 and then written into the cell via a data line DQL. On the other hand, data read out from the selected cell is supplied to the DQ buffer 23 via the data line DQL, then supplied to and latched in the read data latch 19 and output as read data Dout.

The operations of the write data latch 18 and read data latch 19 are controlled by the input-series control circuit 17. The input-series control circuit 17 is controlled by an internal write enable signal INWE output from the internal WE control circuit 6.

As shown in FIG. 3, the input circuit and ATD circuit 11 includes a buffer circuit 2, ATD circuit 3 and AND circuit 4. The buffer circuit 2 includes a buffer 2a to which an external chip enable signal /CE is input, a buffer 2b to which an external row address signal ADx is input, a buffer 2c to which an external column address signal ADy is input, and a buffer 2d to which an external write enable signal /WE is input.

The ATD circuit 3 includes ATDs 3a to 3d which are respectively supplied with output signals of the buffers 2a to 2d and detect the transitions of the signals. Signals ATDCE, ATDADx, ATDADy and ATDWE indicating the results of detection output from the ATDs 3a to 3d are supplied to the input terminals of the AND circuit 4 and the logical product thereof is derived. A logical product signal ATDSUM output from the AND circuit 4 is supplied to the internal CE control circuit 1.

Further, the output signals of the buffers 2a, 2d are supplied to the input terminals of a NOR circuit 5. The NOR circuit 5 supplies a signal WEEBL which is used to start the write operation to the internal WE control circuit 6 when the external chip enable signal /CE and external write enable signal /WE are both set at the "L" level.

The internal chip enable signal INCE output from the internal CE control circuit 1 is supplied to a plate line control circuit (PL Control) 7 and word line control circuit (WL Control) 8. An output signal of the plate line control circuit 7 is supplied to a read/write control and selection circuit 9 and an output signal of the word line control circuit 8 is supplied to a read/write control and selection circuit 10. The read/write control and selection circuits 9, 10 are controlled by the internal write enable signal INWE output from the internal WE control circuit 6 to determine whether an internal timeout circuit or the external write enable signal /WE is used to perform the control operation according to the read operation or write operation.

In the read/write control and selection circuit 9, a pulse generator (Auto pulse) 9A which functions as an internal timeout circuit and outputs a pulse signal with preset width and a pulse generator (Ext. pulse) 9B which outputs a pulse signal in response to the transition of the external write enable signal /WE at the write operation time are provided. A read control signal CSR output from the plate line control circuit 7 is supplied to the pulse generator 9A and a write control signal CSW is supplied to the pulse generator 9B. A drive signal (internal circuit control signal) to drive the plate line PL is output from the read/write control and selection circuit 9. The operation of driving the plate line PL is performed by the pulse generator 9A at the read operation time and by the pulse generator 9B at the write operation time.

Likewise, in the read/write control and selection circuit 10, a pulse generator (Auto pulse) 10A which functions as an internal timeout circuit and outputs a pulse signal with preset width and a pulse generator (Ext. pulse) 10B which outputs a pulse signal in response to the transition of the external write enable signal /WE at the write operation time are provided. A read control signal CSR output from the word line control circuit 8 is supplied to the pulse generator 10A and a write control signal CSW is supplied to the pulse generator 10B. A drive signal (internal circuit control signal) to drive the word line WL is output from the read/write control and selection circuit 10. The operation of driving the word line WL is performed by the pulse generator 10A at the read operation time and by the pulse generator 10B at the write operation time.

In the memory cell array 15, ferroelectric cells MC1 each having a one-transistor/one-capacitor structure as shown in FIG. 5A are arranged in a matrix form. A ferroelectric material such as lead zirconate titanate ($PbZrTiO_3$:PZT) is used to form a capacitor insulating film in a cell capacitor C1 of the ferroelectric cell MC1.

First, the configuration of the ferroelectric cell MC1 and the data write/read/rewrite operations thereof are simply explained with reference to FIGS. 5A, 5B and 6.

The data write operation with respect to the ferroelectric cell MC1 is performed as follows. That is, while a word line WL is being selected, a plate line PL is pulse-driven from the ground potential ("L" level) to preset potential ("H" level) and then returned to the "L" level. Thus, data on the bit line BL can be written.

On the other hand, the storage data read operation with respect to the ferroelectric cell MC1 is performed by pulse-driving the plate line PL from the "L" level to the "H" level while the word line WL is being selected and thus charges can be read out onto the bit line BL.

That is, the cell capacitor C1 of the ferroelectric cell MC1 shown in FIG. 5A is set in a polarization state in which one of two polarization directions of upward and downward directions indicated as "0" and "1" in FIG. 6 is set when no voltage is applied between the electrodes thereof and forms a non-volatile memory. If voltage is applied between the electrodes, the polarization state is not inverted when the state of "1" is set, but the polarization state is inverted when the state of "0" is set. In the above two states, a charge amount required for applying the same voltage, in other words, a charge amount caused in one of the two electrodes according to the storage state of "0", "1" when the same voltage is applied to the other electrode is different. Storage data is read by detecting a difference between the charge amounts. The data read operation of the ferroelectric memory is a destructive read operation and it is necessary to perform the rewrite operation without fail after the read operation is performed.

As shown in FIG. 5B, in the data rewrite operation of the ferroelectric cell MC1 shown in FIG. 5A, the data "0" rewrite operation is performed when data is sensed and amplified by use of a sense amplifier at the read time if the read data is "0". On the other hand, if read data is "1", the data "1" rewrite operation is started after returning the plate line PL from the "H" level to the "L" level.

In the semiconductor integrated circuit device according to the first embodiment, the ATD circuit which is conventionally used only for detection of the address transition is also used for detection of the transition of the external input signal such as the external chip enable signal /CE and external write enable signal /WE. The transitions of the external chip enable signal /CE, external write enable signal /WE and address (row address and column address) signal are detected by the ATD circuit 3 to control access to the memory cell array 15.

Figure 7A:
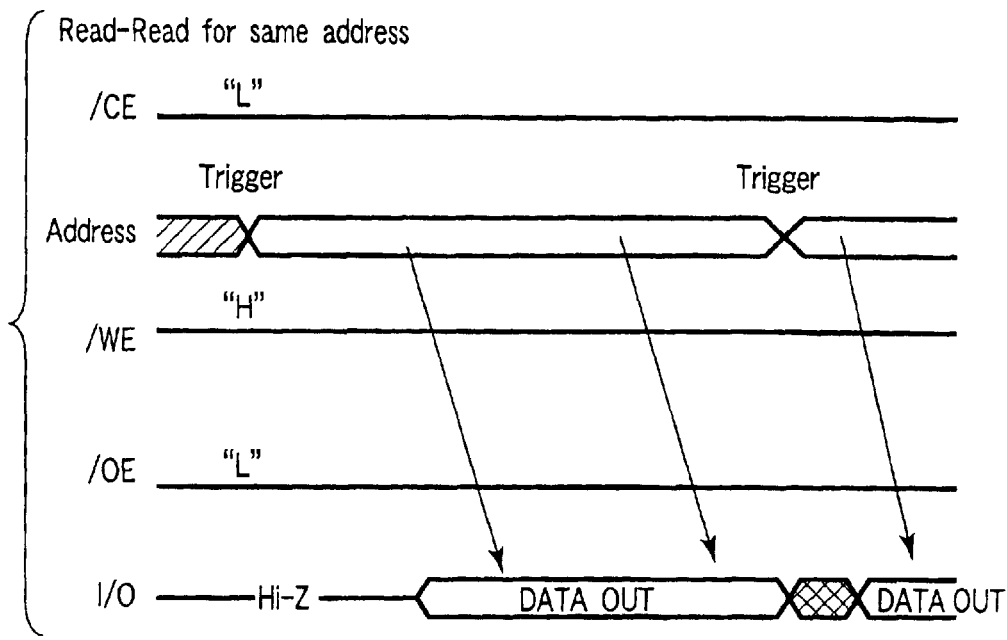
FIG. 7A is a timing chart showing the read-read operation for the same address, for illustrating the operation of the semiconductor integrated circuit device shown in FIGS. 3, 4, 5A and 5B.
Figure 7B:
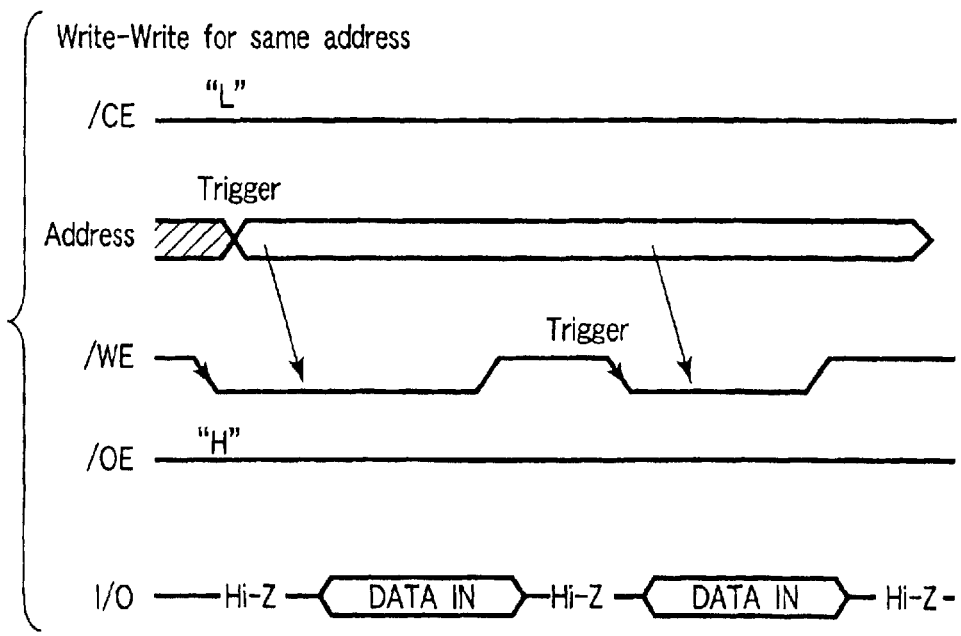
FIG. 7B is a timing chart showing the write-write operation for the same address, for illustrating the operation of the semiconductor integrated circuit device shown in FIGS. 3, 4, 5A and 5B.
Figure 8A:
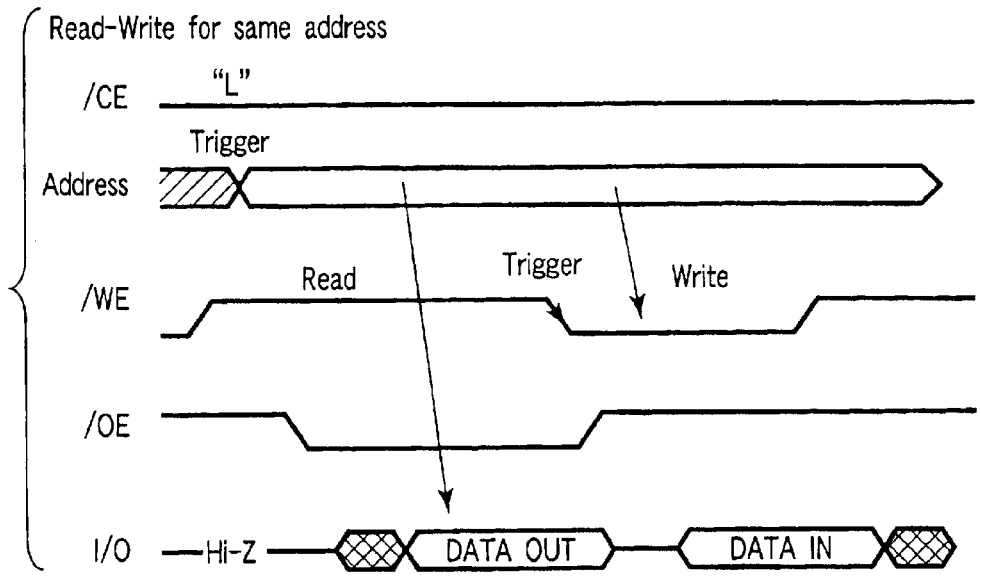
FIG. 8A is a timing chart showing the read-write operation for the same address, for illustrating the operation of the semiconductor integrated circuit device shown in FIGS. 3, 4, 5A and 5B.
Figure 8B:
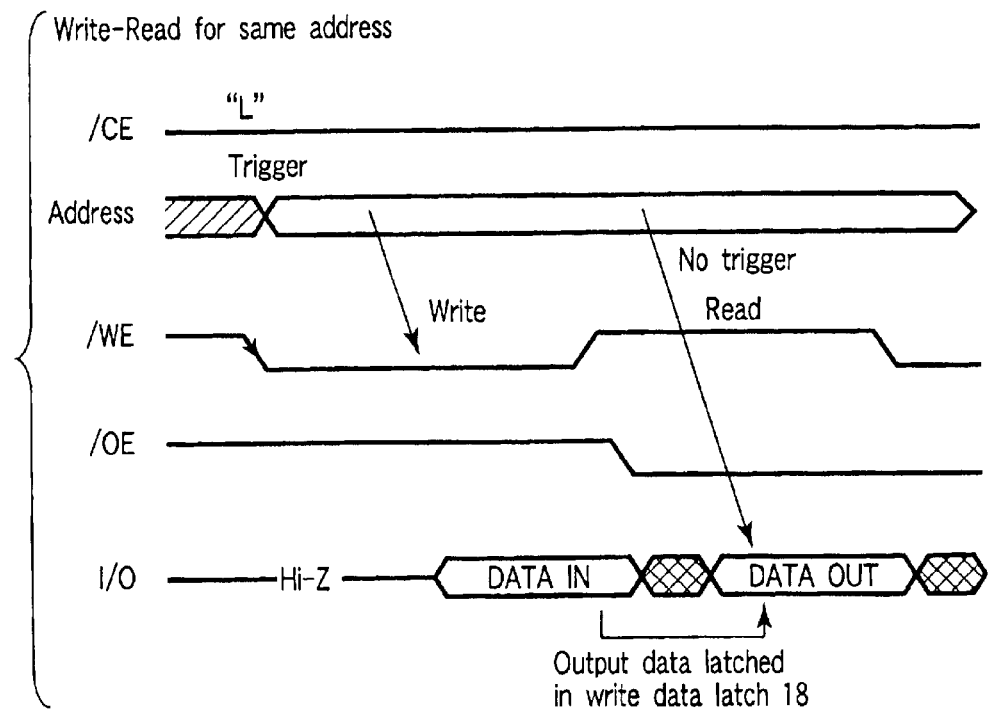
FIG. 8B is a timing chart showing the write-read operation for the same address, for illustrating the operation of the semiconductor integrated circuit device shown in FIGS. 3, 4, 5A and 5B.

Next, a case wherein the address transition is kept unchanged as shown by timing charts of FIGS. 7A, 7B, 8A and 8B, that is, the read-read operation for the same address shown in FIG. 7A, the write-write operation shown in FIG. 7B, the read-write operation shown in FIG. 8A, and the write-read operation shown in FIG. 8B are explained.

In the read-read operation for the same address as shown in FIG. 7A, data is read by using the transition of an address as a trigger like the conventional case and read data is continuously output. At this time, the external write enable signal /WE is fixed at the "H" level and the external chip enable signal /CE and output enable signal /OE are set at the "L" level. Data (DATA OUT) read out from a cell MC1 selected from the memory cell array 15 is supplied to the read data latch 19 via the data line DQL and then output from the read data latch 19 as read data Dout. The read data Dout is continuously output also in the next read cycle.

In the write-write operation for the same address as shown in FIG. 7B, after data is written by using the address transition as a trigger, data is written again into a location of the same address by using the transition (trailing edge) of a next external write enable signal /WE as a trigger. At this time, the external chip enable signal /CE is set at the "L" level and the output enable signal /OE is fixed at the "H" level. The external write enable signal /WE is set to the "L" level each time the write operation is performed. First, write data Din supplied to the write data latch 18 is written into a cell MC1 selected from the memory cell array 15 via the data line DQL (DATA IN). Next, the write data Din supplied to the write data latch 18 is written again into the cell MC1 of the same address in the memory cell array 15 via the data line DQL (DATA IN).

Further, in the read-write operation for the same address as shown in FIG. 8A, after data is read by using the address transition as a trigger, data is written again into a location of the same address by using the transition (trailing edge) of a next external write enable signal /WE as a trigger. At this time, the external chip enable signal /CE is set at the "L" level and the external write enable signal /WE is set to the "H" level in the read operation and to the "L" level in the write operation. The output enable signal /OE is set to the "L" level at the read operation time. First, data (DATA OUT) read out from a cell MC1 of a selected cell in the memory cell array 15 is supplied to the read data latch 19 via the data line DQL and then output from the read data latch 19 as read data Dout. Next, write data Din supplied to the write data latch 18 is written into a cell MC1 of the same address in the memory cell array 15 via the data line DQL (DATA IN).

In the case of the write-read operation for the same address as shown in FIG. 8B, since no trigger is supplied to the ATD circuit 3 when the read operation is started, a method for directly reading out data written into the write data latch 19 without triggering the chip and outputting the above data as read data Dout is used. Therefore, after data is written by using the address transition as a trigger, data is read without using any trigger. At this time, the external chip enable signal /CE is set at the "L" level and the external write enable signal /WE is set to the "L" level in the write operation and to the "H" level in the read operation. The output enable signal /OE is set to the "L" level at the read operation time. First, write data Din supplied to the write data latch 18 is written into a cell MC1 of an address selected in the memory cell array 15 via the data line DQL (DATA IN). At the next data read time, data latched in the write data latch 18 is directly output as read data Dout.

With the above configuration, the timeout circuit is used to control the operation of the internal circuit like the conventional case at the read operation time and the cycle time can be determined from the exterior by using the external input signal (external write enable signal /WE) at the write operation time. Therefore, even if the asynchronous operation is performed, the degree of freedom of the write operation can be enhanced and the operability by the user can be enhanced.

[Second Embodiment]

Figure 9:
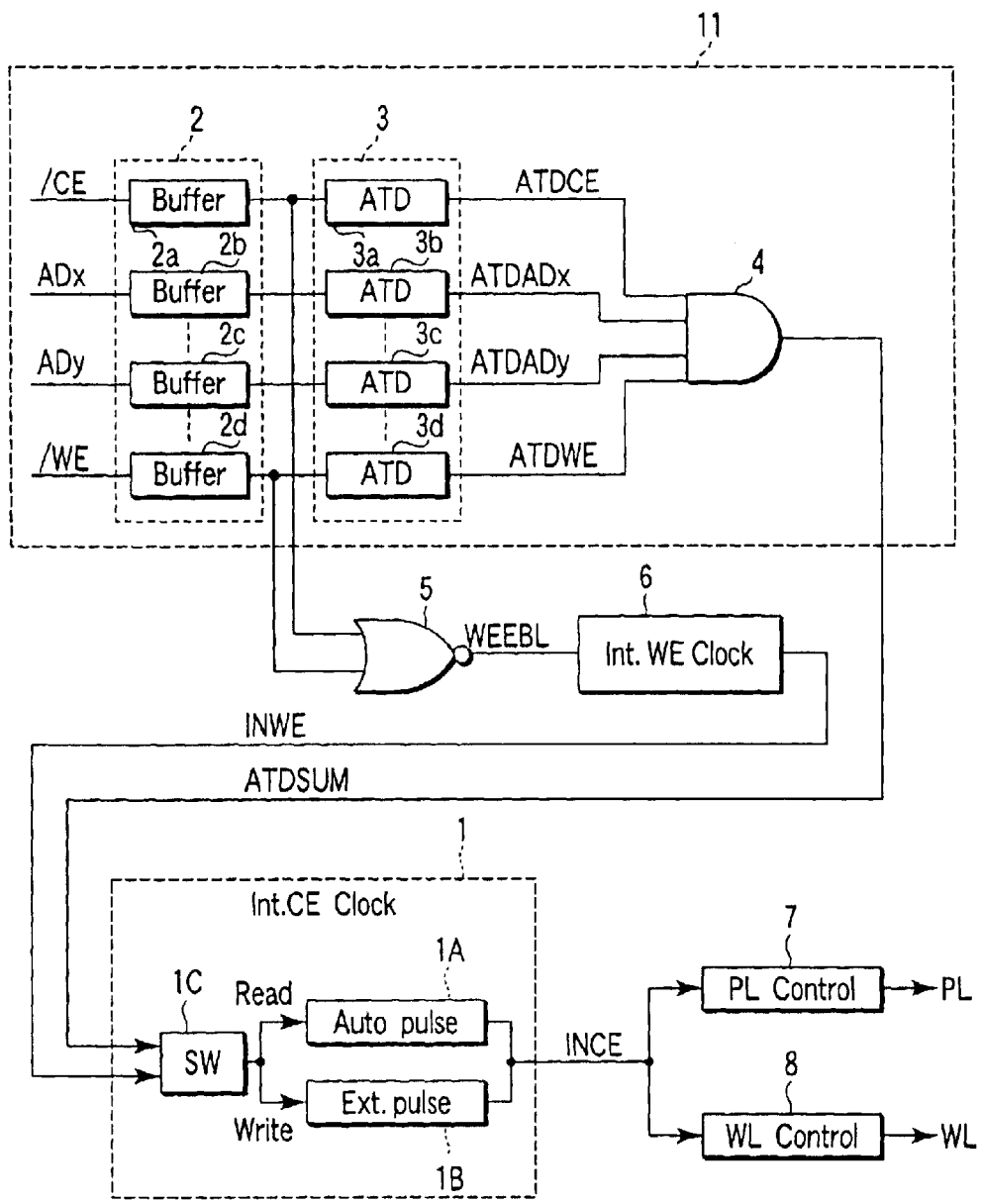
FIG. 9 is a block diagram showing an example of the configuration of the extracted main portion of a pseudo-SRAM formed in a semiconductor integrated circuit device, for illustrating the semiconductor integrated circuit device according to a second embodiment of the present invention.
Figure 10A:
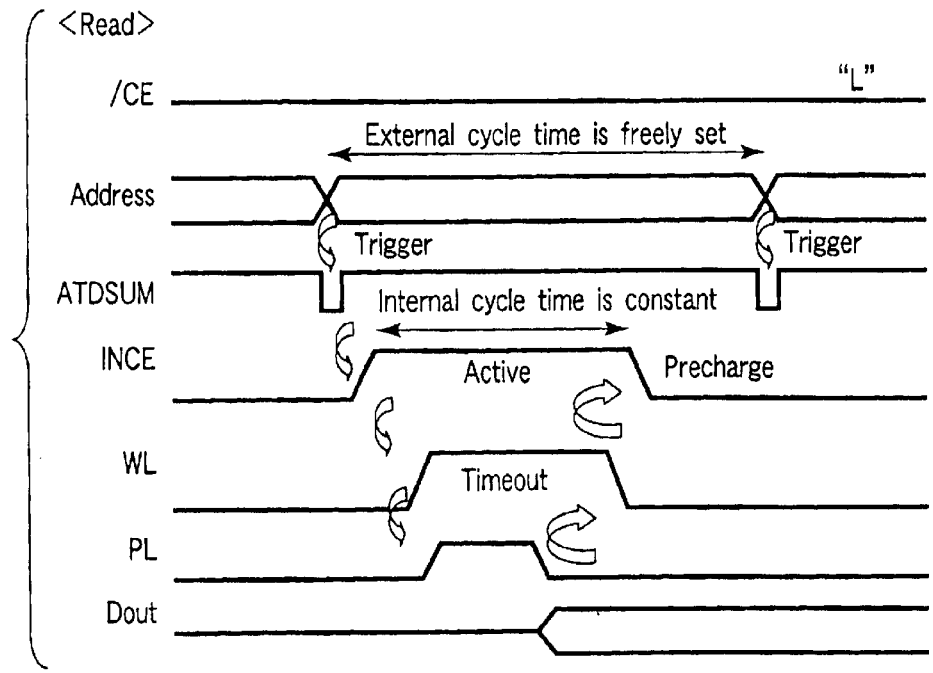
FIG. 10A is a timing chart showing the read operation, for illustrating the operation of the semiconductor integrated circuit device according to the second embodiment of the present invention.
Figure 10B:
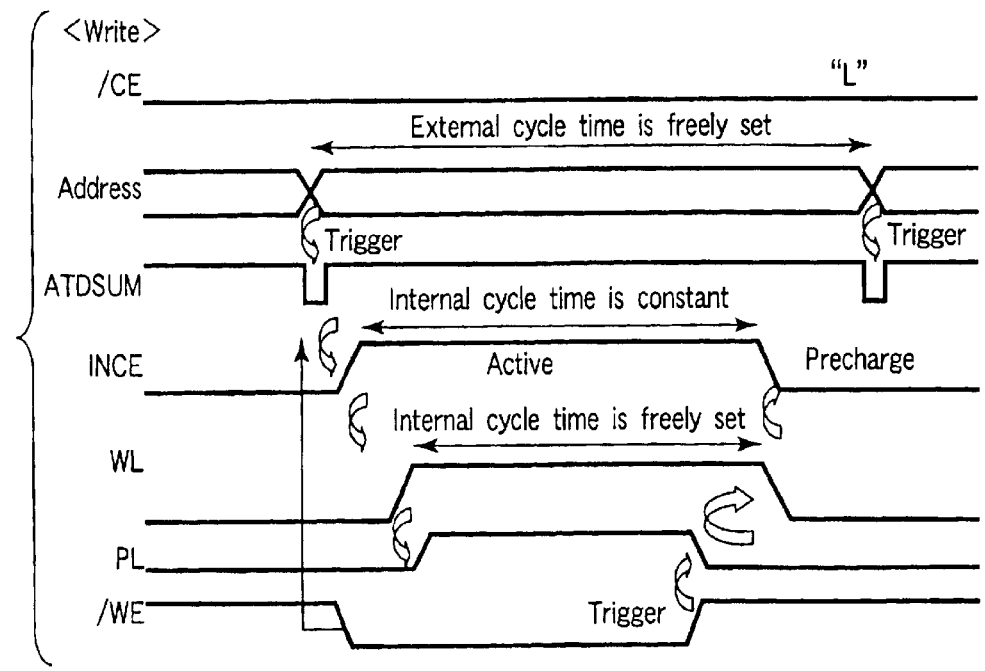
FIG. 10B is a timing chart showing the write operation, for illustrating the operation of the semiconductor integrated circuit device according to the second embodiment of the present invention.
Figure 11:
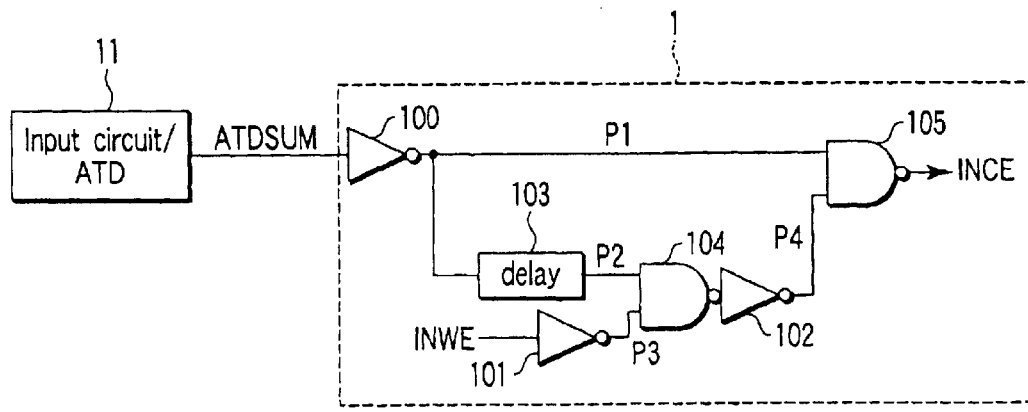
FIG. 11 is a circuit diagram showing an example of the detail configuration of an internal CE control circuit shown in FIG. 9, for illustrating the semiconductor integrated circuit device according to the second embodiment of the present invention.
Figure 12A:
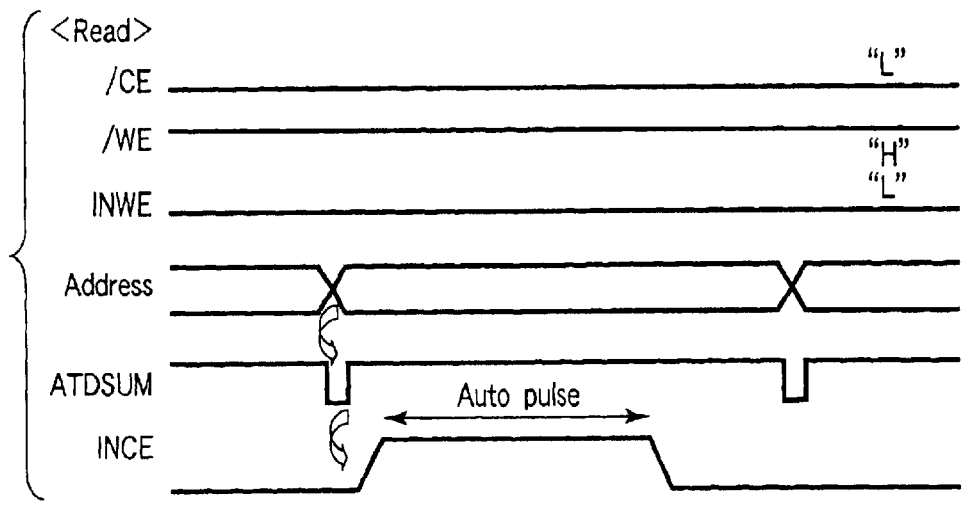
FIG. 12A is a timing chart showing the read operation to illustrate the operation of the internal CE control circuit shown in FIG. 9, for illustrating the semiconductor integrated circuit device according to the second embodiment of the present invention.
Figure 12B:
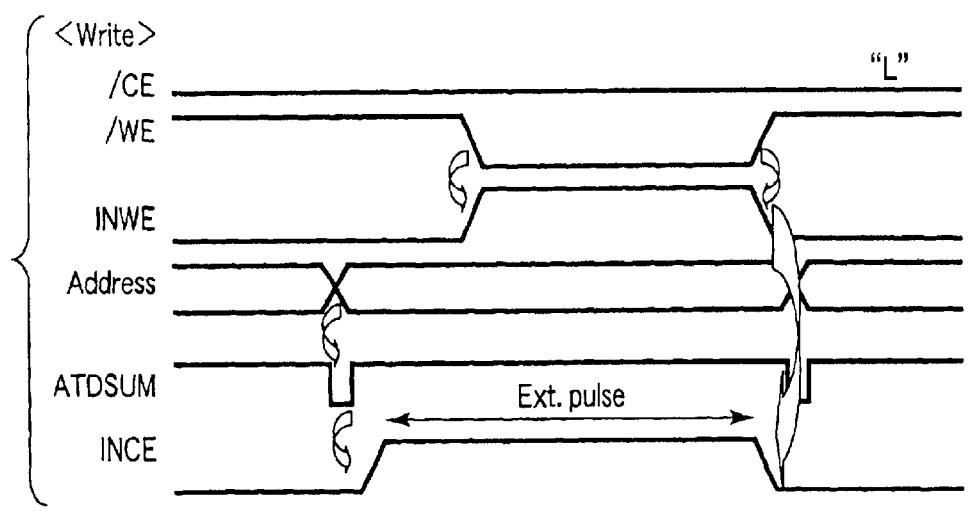
FIG. 12B is a timing chart showing the write operation to illustrate the operation of the internal CE control circuit shown in FIG. 9, for illustrating the semiconductor integrated circuit device according to the second embodiment of the present invention.

FIGS. 9, 10A, 10B, 11, 12A and 12B illustrate a semiconductor integrated circuit device according to a second embodiment of the present invention. FIG. 9 is a block diagram showing an example of the detail configuration of the main portion of a pseudo-SRAM and FIGS. 10A and 10B are timing charts for illustrating the operation of the circuit shown in FIG. 9. FIG. 10A shows the read operation and FIG. 10B shows the write operation. FIG. 11 is a circuit diagram showing an example of the configuration of an internal CE control circuit. FIGS. 12A and 12B are timing charts for illustrating the operation of the circuit shown in FIG. 11. FIG. 12A shows the read operation and FIG. 12B shows the write operation.

In the semiconductor integrated circuit device according to the first embodiment described above, the read/write control and selection circuits 9, 10 which selectively switch the read and write pulse generators 9A, 9B and 10A, 10B are respectively provided for the plate line control circuit 7 and word line control circuit 8 as shown in FIG. 3. On the other hand, in the second embodiment of the present invention, as shown in FIG. 9, a corresponding circuit is provided in an internal CE control circuit 1 and a plate line control circuit 7 and word line control circuit 8 are controlled by use of the internal CE control circuit 1. In this respect, the second embodiment is different from the first embodiment.

That is, in the internal CE control circuit (Int. CE Clock) 1, a switch (SW) 1C, a pulse generator (Auto pulse) 1A which functions as an internal timeout circuit and outputs a pulse signal of preset width and a pulse generator (Ext. pulse) 1B which outputs a pulse signal in response to the transition of the external write enable signal /WE at the write operation time are provided. A logical product signal ATDSUM output from the AND circuit 4 and an internal write enable signal INWE output from an internal WE control circuit 6 are supplied to the switch 1C. A signal selected by the switch 1C is supplied to the pulse generators 1A, 1B. Then, an internal chip enable signal INCE output from the pulse generators 1A, 1B is supplied to the plate line control circuit 7 and word line control circuit 8.

In the second embodiment of the present invention, the read operation is controlled by use of the internal timeout circuit like the case of the conventional asynchronous configuration. The configuration is made such that the control operation by the internal timeout circuit will be interrupted when the period of a write instruction of the external write enable signal /WE is longer than the internal timeout time period and the write operation may be controlled by use of the external write enable signal /WE.

In other words, when the transition of the external write enable signal /WE is detected by the ATD 3d before the end of the period specified by the internal timeout circuit occurs at the time of the write operation with respect to the memory cell array 15, the operation of the memory cell array 15 is controlled by the internal timeout circuit. Further, when the transition of the external write enable signal /WE is detected by the ATD 3d after the lapse of the period specified by the internal timeout circuit, the operation of the memory cell array 15 is controlled in response to the transition of the external write enable signal /WE.

Figure 1A:
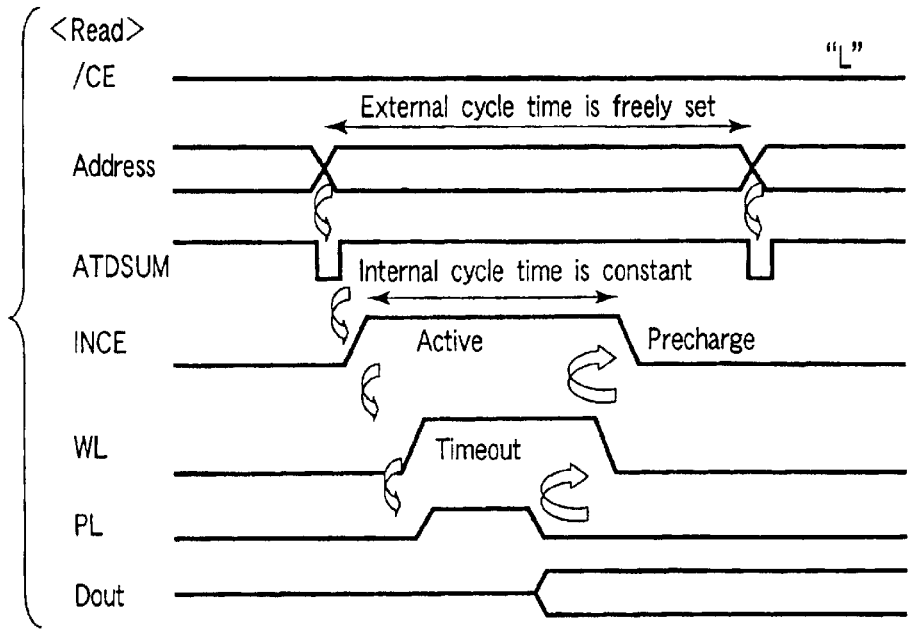
FIG. 1A is a timing chart showing the read operation of an asynchronous type pseudo-SRAM, for illustrating the conventional semiconductor integrated circuit device.
Figure 1B:
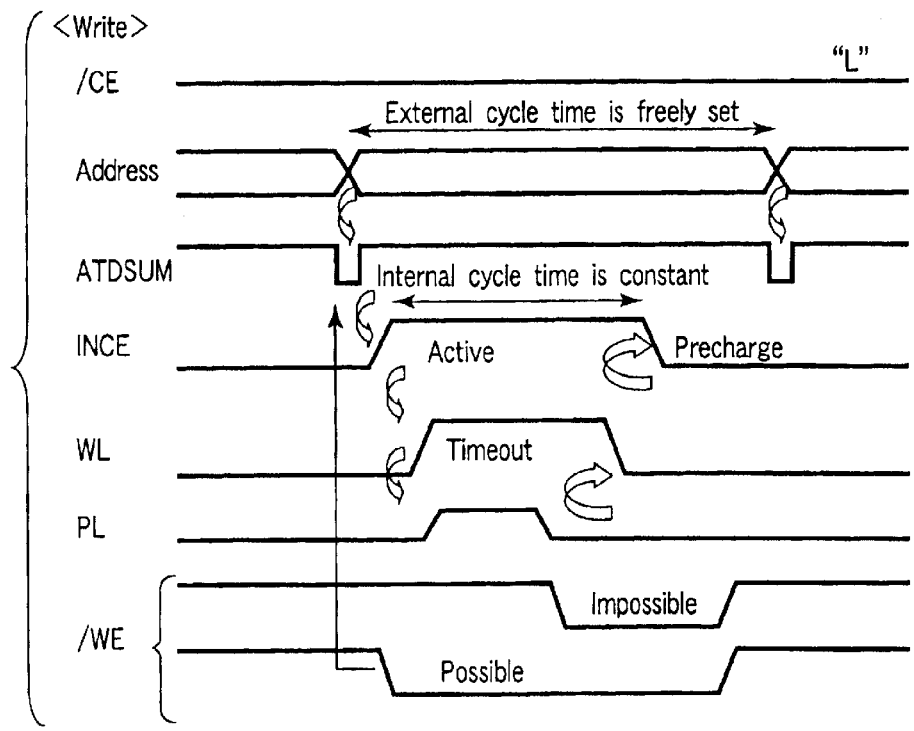
FIG. 1B is a timing chart showing the write operation of the asynchronous type pseudo-SRAM, for illustrating the conventional semiconductor integrated circuit device.
Figure 2:
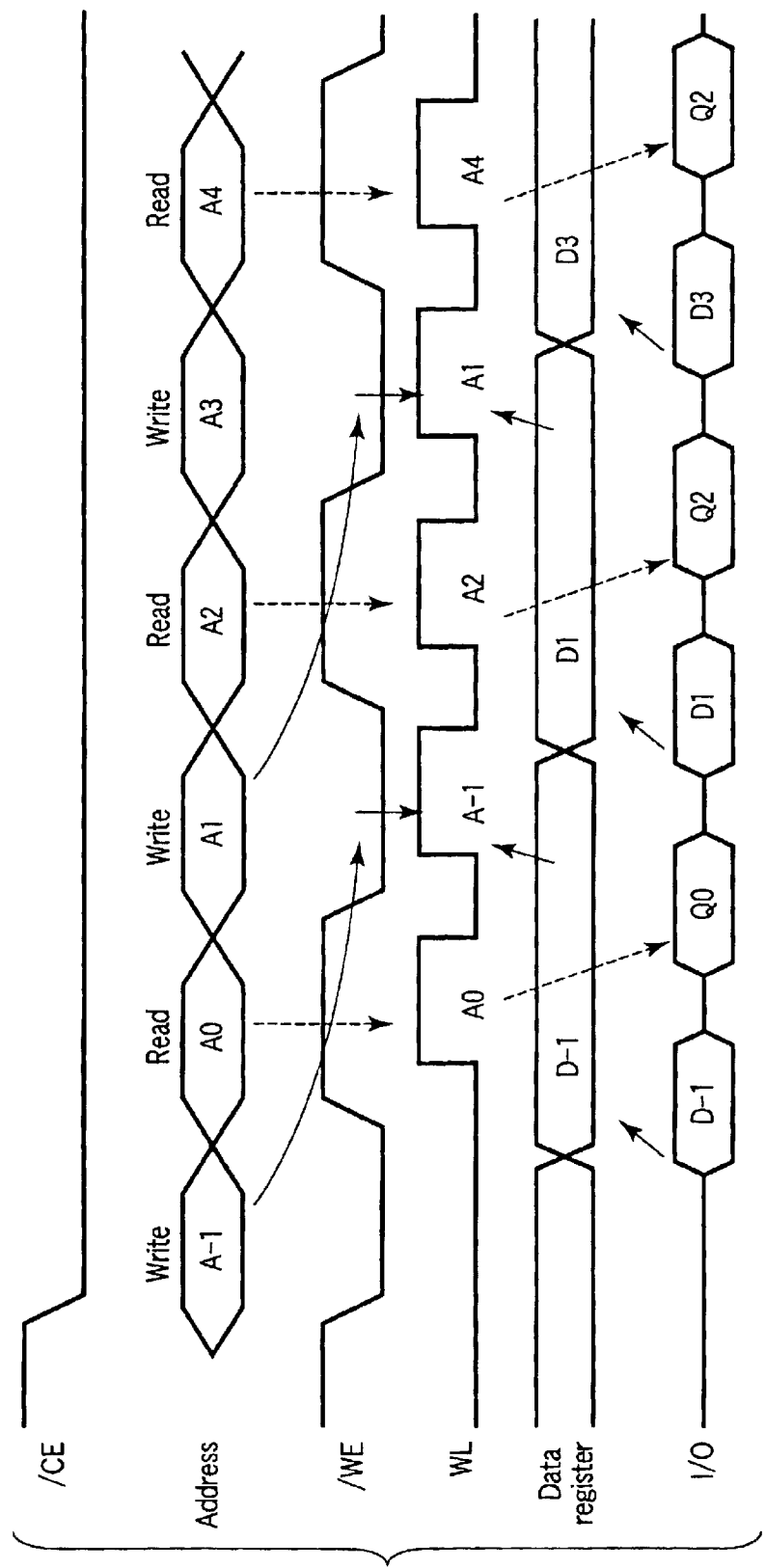
FIG. 2 is a timing chart showing the write operation based on a delayed write method, for illustrating the conventional semiconductor integrated circuit device.

The read operation shown in FIG. 10A is the same as the read operation in the conventional semiconductor integrated circuit device shown in FIG. 1A.

In the write operation shown in FIG. 10B, if the write operation is started by using the address transition as a trigger and the period of a write instruction of the external write enable signal /WE is shorter than the period of the internal timeout time, the control operation is performed by use of the internal timeout circuit. Then, if the period of the write instruction of the external write enable signal /WE exceeds the period of the internal timeout time, the control operation by use of the internal timeout circuit is interrupted and the control operation is performed by use of the external write enable signal /WE. For example, the precharge operation of the word line WL or plate line PL is started by using the rise edge of the external write enable signal /WE as a trigger.

Thus, like the first embodiment, in the second embodiment, the operation of the internal circuit is controlled by use of the timeout circuit at the read operation time. Since the cycle time of the write operation is determined by the external write enable signal /WE, the degree of freedom of the write operation can be enhanced.

FIG. 11 shows a concrete example of the configuration of the internal CE control circuit 1 to realize the semiconductor integrated circuit device according to the second embodiment. The internal CE control circuit 1 is a pulse generator configured to include inverters 100, 101, 102, delay circuit 103 and NAND circuits 104, 105. A logical product signal ATDSUM output from the input circuit and ATD circuit (input circuit/ATD) 11 is supplied to the input terminal of the inverter 100. An output signal P1 of the inverter 100 is supplied to the delay circuit 103 and one input terminal of the NAND circuit 105. A delay signal P2 output from the delay circuit 103 is supplied to one input terminal of the NAND circuit 104.

An internal write enable signal INWE output from the internal WE control circuit 6 is supplied to the input terminal of the inverter 101. An output signal P3 of the inverter 101 is supplied to the other input terminal of the NAND circuit 104. An output signal of the NAND circuit 104 is supplied to the input terminal of the inverter 102 and an output signal P4 of the inverter 102 is supplied to the other input terminal of the NAND circuit 105. An internal chip enable signal INCE is output from the output terminal of the NAND circuit 105.

The circuit shown in FIG. 11 performs the operation as shown by the timing charts of FIGS. 12A and 12B. As shown in FIG. 12A, in the read operation, when the transition of an address signal is detected by the input circuit and ATD circuit (input circuit/ATD) 11, the logical product signal ATDSUM is set to the "L" level. As a result, the output signal P1 of the inverter 100 is set to the "H" level to cause the internal chip enable signal output from the NAND circuit 105 to be set to the "H" level. Further, the output signal P1 of the inverter 100 is delayed by the delay circuit 103 and then supplied to one input terminal of the NAND circuit 104. At this time, since the internal write enable signal INWE output from the internal WE control circuit 6 is always set at the "L" level, the output signal P3 of the inverter 101 is always set at the "H" level. Therefore, the output signal of the NAND circuit 104 is set to the "L" level and the output signal P4 of the inverter 102 is set to the "H" level. As a result, the internal chip enable signal INCE output from the NAND circuit 105 is set to the "L" level. That is, the internal CE control circuit 1 functions as a pulse generator which generates a pulse signal (Auto pulse) which is kept at the "H" level from the time the logical product signal ATDSUM is set to the "L" until the time the delay time by the delay circuit 103 has elapsed.

As shown in FIG. 12B, in the write operation, when the logical product signal ATDSUM output from the input circuit and ATD circuit (input circuit/ATD) 11 which has detected the transition of an address signal is set to the "L" level, the output signal P1 of the inverter 100 is set to the "H" level. Therefore, the internal chip enable signal output from the NAND circuit 105 is set to the "H" level. Further, the output signal P1 of the inverter 100 is delayed by the delay circuit 103 and then supplied to one input terminal of the NAND circuit 104. At this time, since the internal write enable signal INWE output from the internal WE control circuit 6 is set at the "L" level, the output signal P3 of the inverter 101 is set at the "H" level. Therefore, the output signal of the NAND circuit 104 is set to the "L" level and the output signal P4 of the inverter 102 is set to the "H" level. As a result, the internal chip enable signal INCE output from the NAND circuit 105 is set to the "L" level. At this time, if the external write enable signal /WE is set to the "L" within the delay time of the delay circuit 103 and the write operation is started, the internal write enable signal INWE is set to the "H" level. Therefore, the output signal INCE of the internal CE control circuit 1 is kept at the "H" level until the time the external write enable signal /WE is set to the "H" level irrespective of the delay time of the delay circuit 103. That is, the internal CE control circuit 1 functions as a pulse generator which generates a pulse signal (Ext. pulse) which is kept at the "H" level from the time the logical product signal ATDSUM is set to the "L" until the time the external write enable signal /WE is set to the "H" level.

Also, in a case where the cycle operation is started not when the address transition is detected but when the transition of the external write enable signal /WE is detected, the same operation as described above can be performed by using the logical product signal ATDSUM output from the input circuit and ATD circuit (input circuit/ATD) 11. That is, the internal chip enable signal INCE in the write operation is controlled by the external write enable signal /WE irrespective of the internal timeout time.

Therefore, like the first embodiment, according to the above configuration, the timeout circuit is used to control the operation of the internal circuit at the read operation time and the cycle time can be determined from the exterior by using the external input signal (external write enable signal /WE) at the write operation time. Therefore, even if the asynchronous operation is performed, the degree of freedom of the write operation can be enhanced and the operability by the user can be enhanced.

[Third Embodiment]

Figure 14:
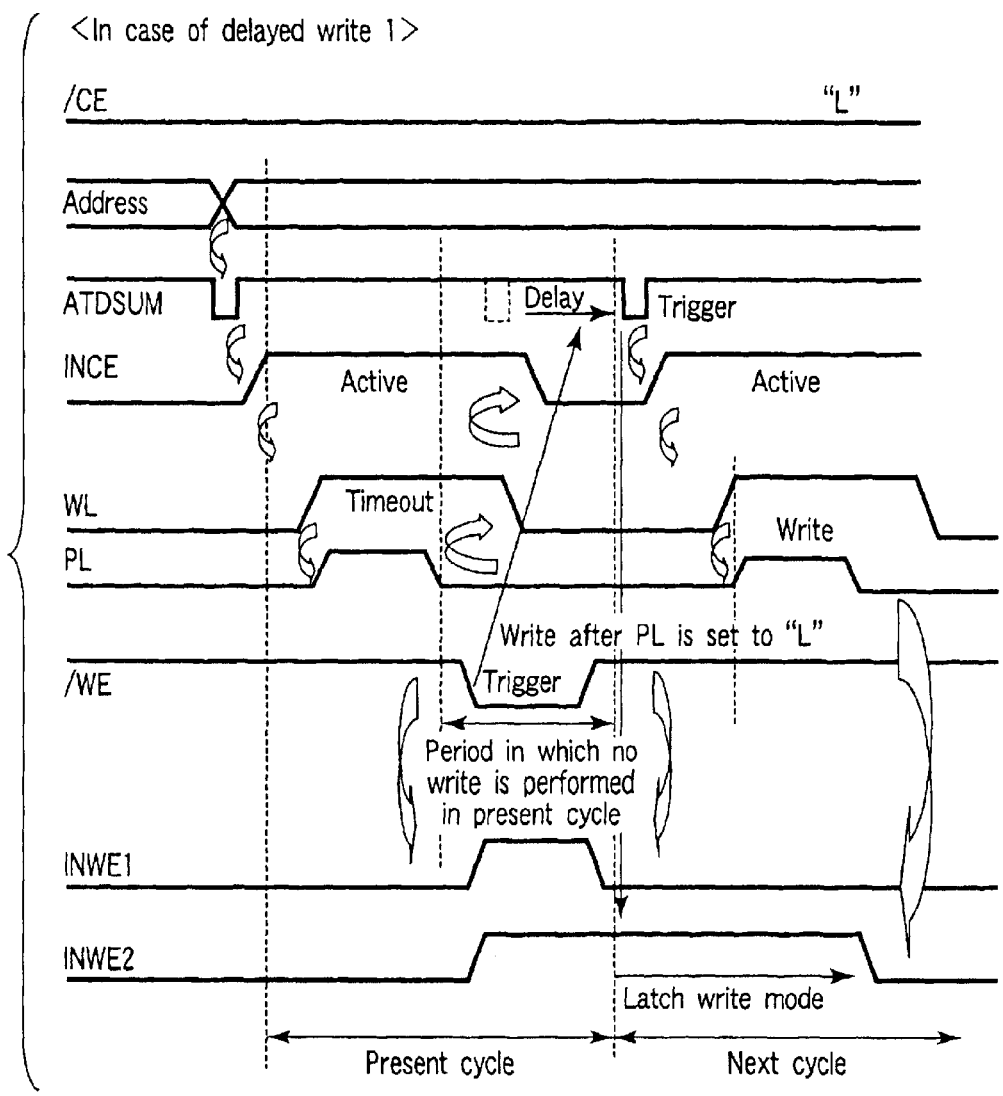
FIG. 14 is a timing chart showing the operation of the pseudo-SRAM shown in FIG. 13, for illustrating the operation of the semiconductor integrated circuit device according to the third embodiment of the present invention.
Figure 15:
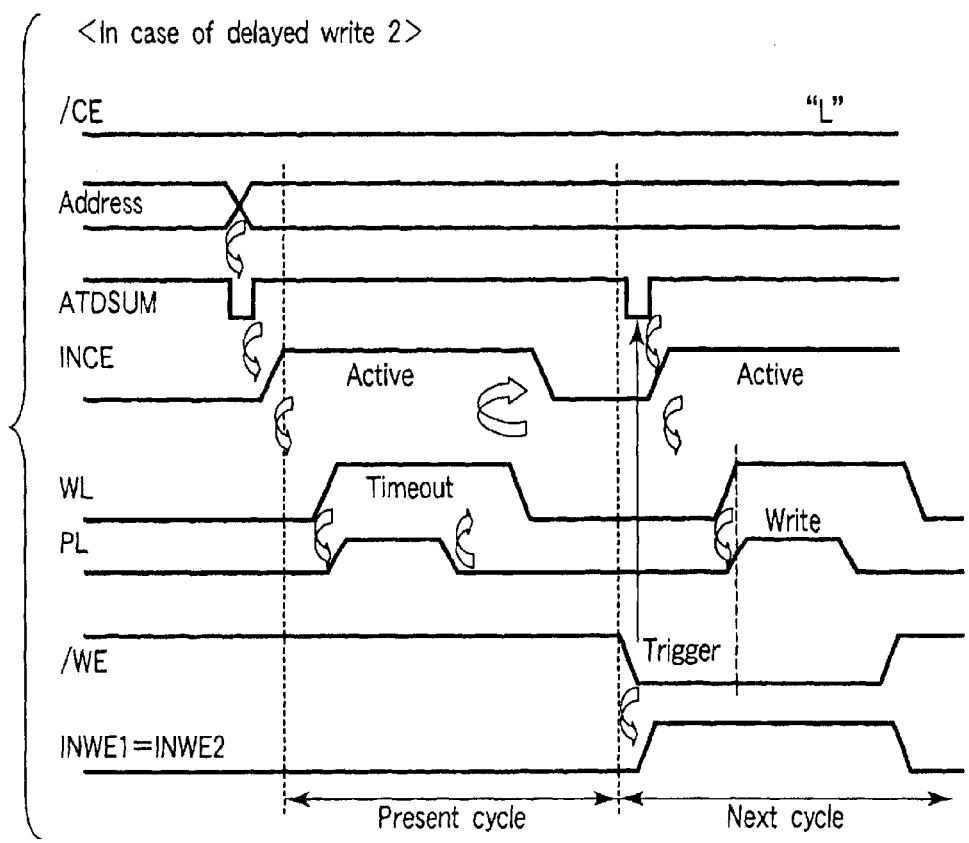
FIG. 15 is a timing chart showing the write operation in the latest case in the semiconductor integrated circuit devices according to the third, fourth and fifth embodiments of the present invention.
Figure 16:
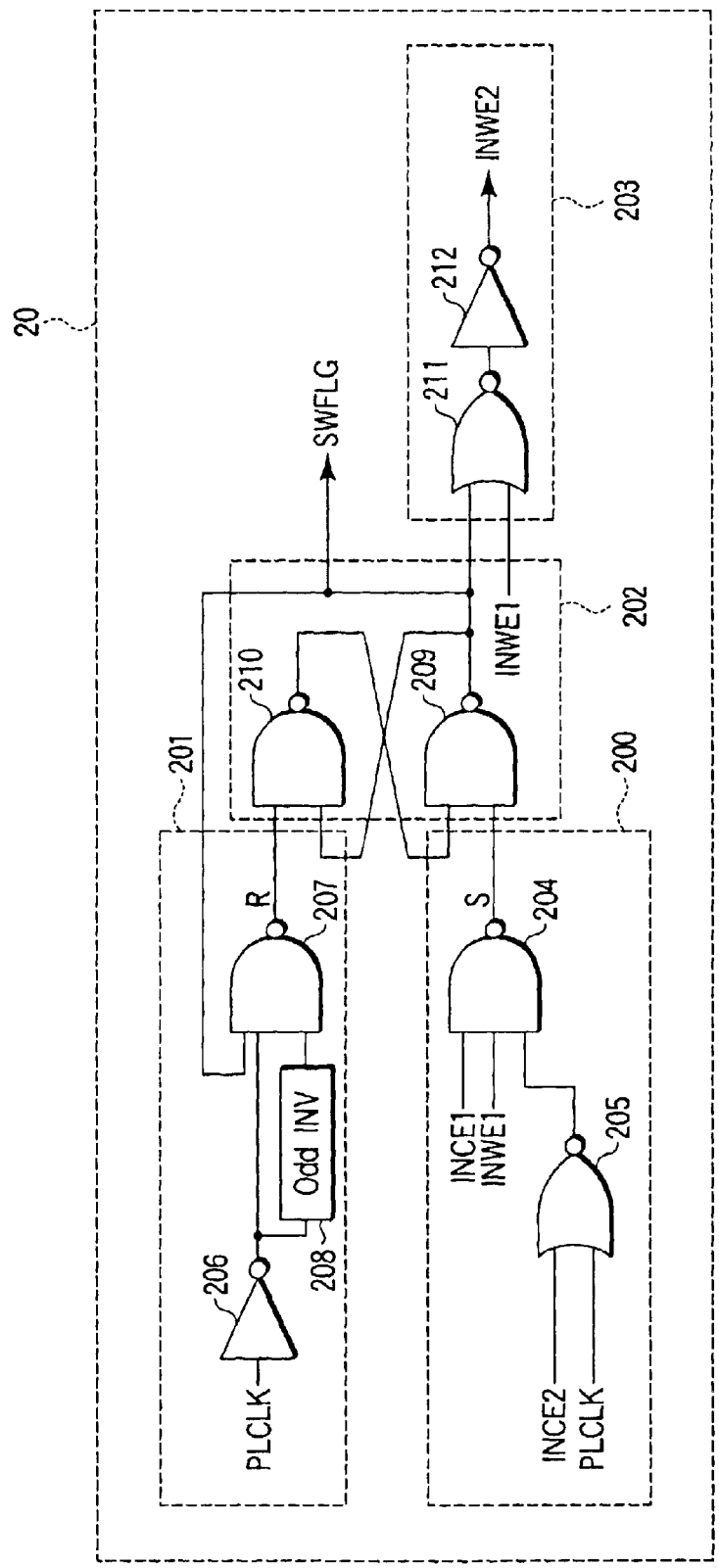
FIG. 16 is a circuit diagram showing an example of the detail configuration of a write mode latch ON/OFF circuit shown in FIG. 13, for illustrating the semiconductor integrated circuit device according to the third embodiment of the present invention.
Figure 17A:
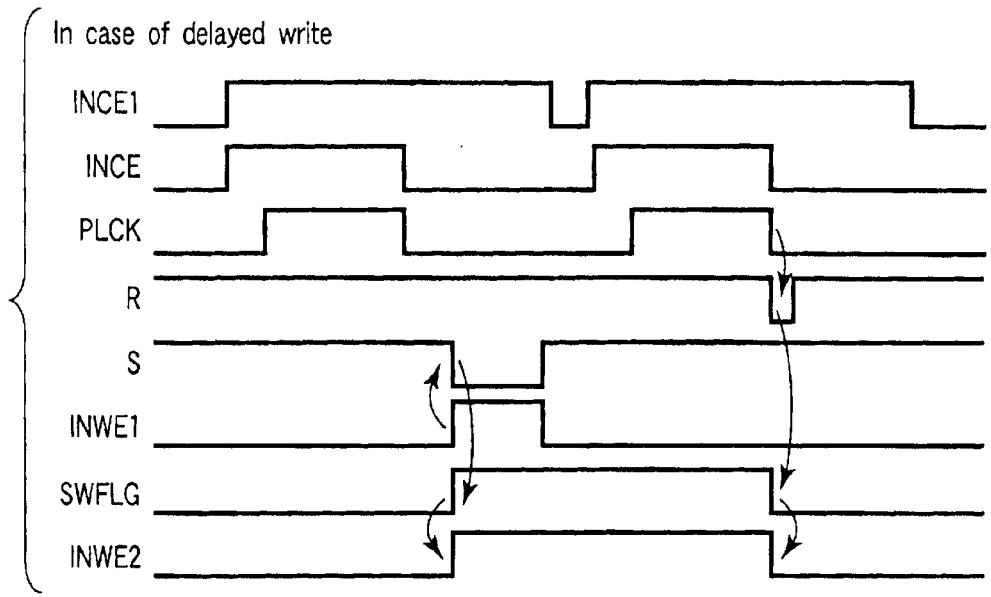
FIG. 17A is a timing chart showing the delayed write operation to illustrate the operation of the write mode latch ON/OFF circuit shown in FIG. 13, for illustrating the semiconductor integrated circuit device according to the third embodiment of the present invention.
Figure 17B:
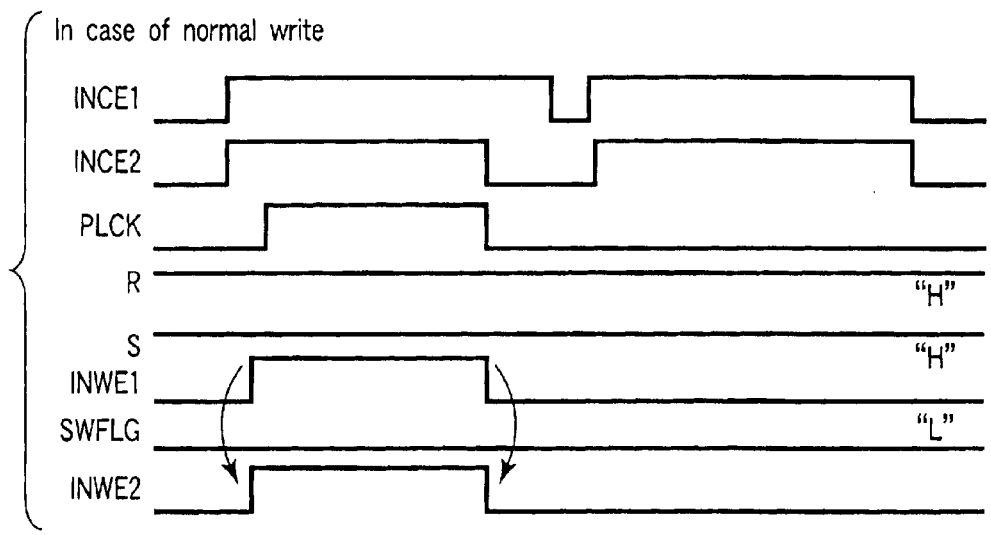
FIG. 17B is a timing chart showing the normal write operation to illustrate the operation of the write mode latch ON/OFF circuit shown in FIG. 13, for illustrating the semiconductor integrated circuit device according to the third embodiment of the present invention.
Figure 18:
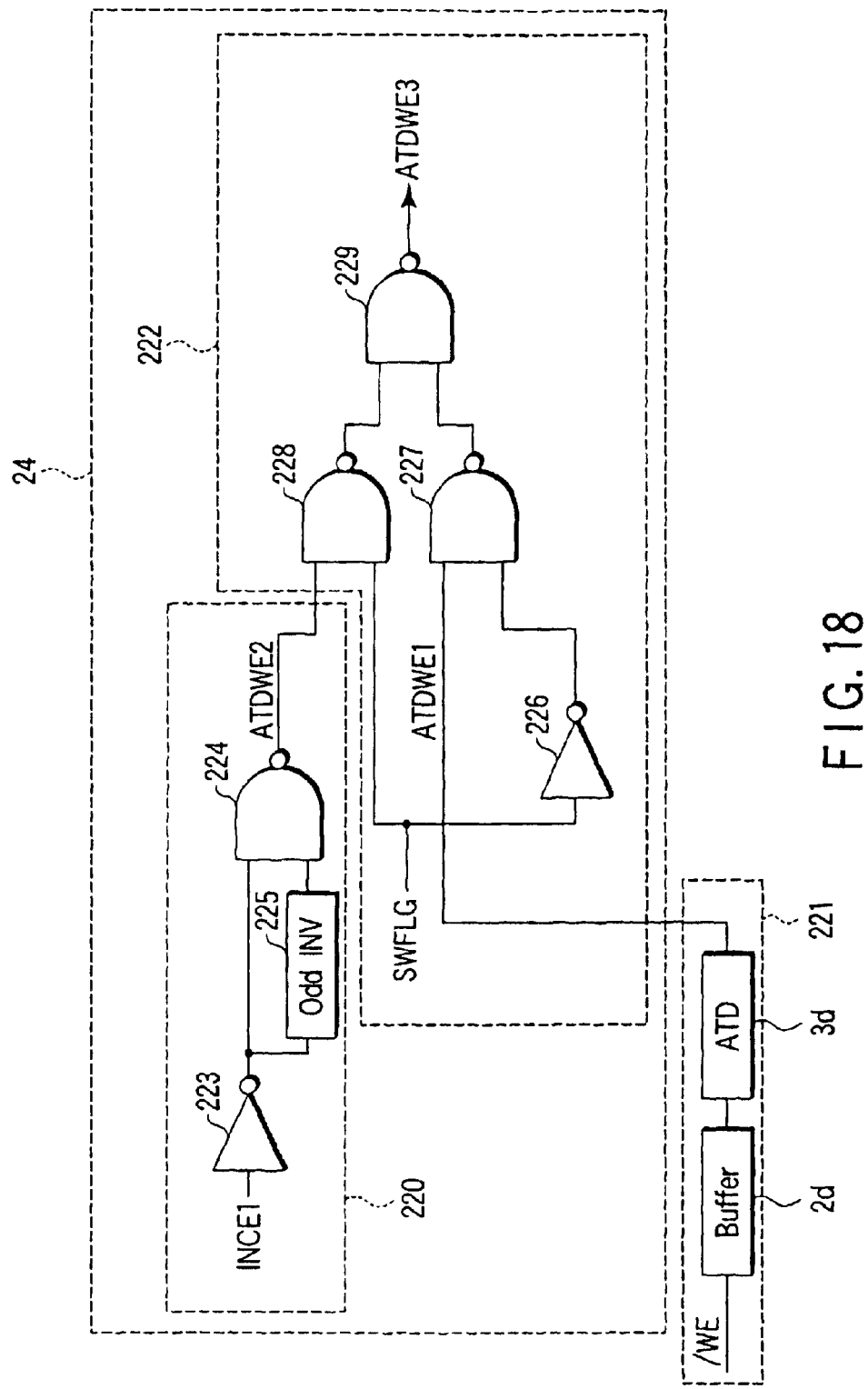
FIG. 18 is a circuit diagram showing an example of the detail configuration of a trigger delay ON/OFF circuit shown in FIG. 13, for illustrating the semiconductor integrated circuit device according to the third embodiment of the present invention.

FIGS. 13, 14, 15, 16, 17A, 17B, 18, 19A and 19B illustrate a semiconductor integrated circuit device according to a third embodiment of the present invention. FIG. 13 is a block diagram showing an example of the detail configuration of the main portion of a pseudo-SRAM, and FIGS. 14 and 15 are timing charts showing the operation of the pseudo-SRAM. FIG. 16 is a circuit diagram showing an example of the configuration of a write mode latch ON/OFF circuit, and FIGS. 17A and 17B are timing charts for illustrating the operations of the circuit shown in FIG. 16. FIG. 17A shows the delayed write operation and FIG. 17B shows the normal write operation. FIG. 18 is a circuit diagram showing an example of the configuration of a trigger delay ON/OFF circuit, and FIGS. 19A and 19B are timing charts for illustrating the operation of the circuit shown in FIG. 18. FIG. 19A shows the delayed write operation and FIG. 19B shows the normal write operation.

As shown in FIG. 13, the semiconductor integrated circuit device according to the third embodiment additionally includes a trigger delay ON/OFF circuit 24 provided between the AND circuit 4 and the ATD 3d which detects the transition of the external write enable signal /WE and a write mode latch ON/OFF circuit 20 connected to the output terminal of a first internal WE control circuit 6 in the semiconductor integrated circuit device of the second embodiment shown in FIG. 9.

The write mode latch ON/OFF circuit 20 is used to perform the operation of writing data into a cell in the next cycle without performing the data write operation in the present cycle. The write mode latch ON/OFF circuit 20 is supplied with an output signal INWE1 of the first internal WE control circuit (Int. WE Clock 1) 6 and an output signal PLCLK of a plate line control circuit (PL Control) 7. An output signal INWE2 is generated from a second internal WE control circuit 25 according to the output signal of the write mode latch ON/OFF circuit 20 and supplied to a data latch 22. The first internal write enable signal INWE1 is also supplied to an input/output-series control circuit 17.

FIG. 16 shows a concrete example of the configuration of the write mode latch ON/OFF circuit 20. The circuit includes a set signal generating circuit 200, reset signal generating circuit 201, flip-flop circuit 202, logic circuit 203 and the like. The set signal generating circuit 200 includes a NAND circuit 204 and NOR circuit 205. A first internal chip enable signal INCE1 which controls internal cycle time is supplied to the first input terminal of the NAND circuit 204, the first internal write enable signal INWE1 which controls the internal write operation is supplied to the second input terminal thereof and an output signal of the NOR circuit 205 is supplied to the third input terminal thereof. The output signal PLCLK of the plate line control circuit 7 and a second internal chip enable signal INCE2 which controls internal active time are supplied to the input terminals of the NOR circuit 205. A set signal S for the flip-flop circuit 202 is output from the NAND circuit 204.

The reset signal generating circuit 201 includes an inverter 206, NAND circuit 207 and an inverter (odd INV) circuit 208 with an odd number of cascade-connected stages. The output signal PLCLK of the plate line control circuit 7 is supplied to the input terminal of the inverter 206. An output signal of the inverter 206 is supplied to the first input terminal of the NAND circuit 207 and the input terminal of the inverter circuit 208. An output signal of the inverter circuit 208 is supplied to the second input terminal of the NAND circuit 207 and an output signal SWFLG of the flip-flop circuit 202 is supplied to the third input terminal thereof. A reset signal R for the flip-flop circuit 202 is output from the output terminal of the NAND circuit 207.

The flip-flop circuit 202 is configured by NAND circuits 209, 210. A set signal S output from the set signal generating circuit 200 is supplied to one input terminal of the NAND circuit 209 and an output signal of the NAND circuit 210 is supplied to the other input terminal thereof. A reset signal R output from the reset signal generating circuit 201 is supplied to one input terminal of the NAND circuit 210 and an output signal of the NAND circuit 209 is supplied to the other input terminal thereof. A signal SWFLG is output from the output terminal of the NAND circuit 209.

The logic circuit 203 includes a NOR circuit 211 and inverter 212. The output signal SWFLG of the flip-flop circuit 202 is supplied to one input terminal of the NOR circuit 211 and the first internal write enable signal INWE1 is input to the other input terminal thereof. An output signal of the NOR circuit 211 is inverted by the inverter 212 to form a second internal write enable signal INWE2.

The write mode latch ON/OFF circuit 20 is operated as shown by the timing charts of FIGS. 17A and 17B. FIG. 17A shows the delayed write operation and FIG. 17B shows the normal write operation. In the case of the delayed write operation as shown in FIG. 17A, the write operation performed after the end of pulse driving of the plate line is detected by the set signal generating circuit 200, the flip-flop circuit 202 is set and the signal SWFLG is set to the "H" level. The signal SWFLG is maintained at the "H" level until the flip-flop circuit is reset by the reset signal R generated from the reset signal generating circuit 201 has detected the end of pulse driving of the plate line PL in the next cycle. When the signal SWFLG is set to the "H" level, the output signal INWE2 of the logic circuit 203 also changes to the same level.

That is, the operation of setting the write mode is performed according to the first internal write enable signal INWE1 which is generated based on the external write enable signal /WE, but the reset operation is extended till a period in which it is actually possible to perform the write operation with respect to a cell in the next cycle.

On the other hand, in the case of the normal write operation in which the write operation is started while the plate line is being pulse-driven as shown in FIG. 17B, the signal SWFLG is always kept at the "L" level and the output signal INWE2 of the logic circuit 203 is generated based on the first internal write enable signal INWE1.

That is, the second internal write enable signal INWE2 is triggered by the external write enable signal /WE to latch the write mode and hold the write mode 10 until the potential of the plate line PL falls in the next cycle. Further, in the case of the operation (normal write operation) in which the write operation is started after the address transition occurs to start a cycle before the operation of precharging the plate line PL or word line WL is started, the second internal write enable signal INWE2 is generated based on the external write enable signal /WE like the first internal write enable signal INWE1.

The trigger delay ON/OFF circuit 24 is used to accept the transition trigger of the external write enable signal /WE after the end of the cycle without accepting the transition trigger in the present cycle.

FIG. 18 shows a concrete example of the configuration of the trigger delay ON/OFF circuit 24. The trigger delay ON/OFF circuit 24 includes a pulse signal generating circuit 220 and logical switch circuit 222. The pulse signal generating circuit 220 includes an inverter 223, NAND circuit 224 and an inverter (odd INV) circuit 225 with an odd number of cascade-connected stages. A first internal chip enable signal INCE1 is which controls internal cycle time is supplied to the input terminal of the inverter 223 and an output signal of the inverter 223 is supplied to one input terminal of the NAND circuit 224 and the input terminal of the inverter 225. An output signal of the inverter 225 is supplied to the other input terminal of the NAND circuit 224 and a pulse signal ATDWE2 is output from the NAND circuit 224.

The logical switch circuit 222 uses the output signal SWFLG of the write mode latch ON/OFF circuit 20 as a switch signal and selects and outputs one of the output signal ATDWE1 of the signal generating circuit 221 and the output signal ATDWE2 of the pulse signal generating circuit 220. The logical switch circuit 222 includes an inverter 226 and NAND circuits 227, 228, 229. The signal SWFLG is supplied to the input terminal of the inverter 226 and the inverted signal thereof is supplied to one input terminal of the NAND circuit 227. A signal ATDWE1 output from the signal generating circuit 221 is supplied to the other input terminal of the NAND circuit 227 and an output signal thereof is supplied to one input terminal of the NAND circuit 229. Further, the signal SWFLG is supplied to one input terminal of the NAND circuit 228 and the output signal ATDWE2 of the pulse signal generating circuit 220 is supplied to the other input terminal of the NAND circuit 228. An output signal of the NAND circuit 228 is supplied to the other input terminal of the NAND circuit 229. A signal ATDWE3 is output from the output terminal of the NAND circuit 229.

The signal generating circuit 221 indicates part of the input circuit and ATD circuit 11 in the circuit shown in FIG. 13 and is configured by extracting a buffer 2d to which the external write enable signal /WE is input and an ATD (address transition detecting circuit) 3d which detects the transition of the signal /WE. If the transition of the external write enable signal /WE occurs, a signal ATDWE1 is output from the ATD 3d.

The trigger delay ON/OFF circuit 24 is operated as shown by the timing charts of FIGS. 19A and 19B. FIG. 19A shows the delayed write operation and FIG. 19B shows the normal write operation. In the case of the delayed write operation as shown in FIG. 19A, the signal SWFLG is set ("H" level) by the internal write enable signal INWE1 as described before and the reset operation is extended till a period in which it is actually possible to perform the write operation in the next cycle. In a period in which the signal SWFLG is kept at the "H" level, a system of the signal ATDWE2 is made active by the logical switch circuit 222. During the above period, if a cycle end pulse signal ATDWE2 of the first internal chip enable signal INCE1 is generated, a pulse is generated as the output signal ATDWE3 of the logical switch circuit 222.

In the case of the normal write operation as shown in FIG. 19B, the signal SWFLG is always kept at the "L" level and a system of the signal ATDWE1 is made active by the logical switch circuit 222. Then, a pulse is generated as the output signal ATDWE3 of the logical switch circuit 222 based on the output signal ATDWE1 of the ATD 3d which detects the transition of the external write enable signal /WE.

With the above configuration, in the case of the delayed write operation as shown in FIG. 14, the write operation performed after the end of pulse driving of the plate line PL is detected, generation of a trigger by detection of the transition of the external write enable signal /WE is delayed till the end time of the present cycle and the internal CE control signals INCE1 and INCE2 can be generated based on the above operation. Thus, the transition of the external write enable signal /WE occurring in the present cycle is treated as if it occurs in the next cycle, a trigger is generated in response to the transition and the next operation cycle can be started.

Since it is necessary to fetch data in the present cycle in order to acquire write data, the operation of latching write data into the write data latch 18 is performed by use of the input/output-series control circuit 17 to which a signal INWE1 generated based on the external write enable signal /WE is input.

The outline of the above configurations and operations is summarized as follows.

When the write operation is started with delay after the address transition occurs and a cycle starts, first, the read operation is performed. At this time, if the external write enable signal /WE is set to the "L" level before the precharge operation of the plate line PL and word line WL is started (within time defined by the internal timeout circuit), the operation can be controlled by use of the external write enable signal /WE. However, if the write operation is started with extremely long delay, for example, if it is started after the end of pulse driving of the plate line PL (after the change from the "H" level to the "L" level), write data in the present cycle is latched, but the write operation into the cell is not performed in the present cycle. Then, the next cycle is automatically started and the write operation into the cell is performed in the next cycle.

If the write operation is started with longer delay than in the above case, for example, if the external write enable signal /WE is set to the "L" level after lapse of the cycle time as shown in the timing chart of FIG. 15, the same operation as in the normal case is performed. Then, a trigger is generated from the ATD circuit 3 which has detected that the external write enable signal /WE is set to the "L" level.

If the external write enable signal /WE is changed from the "L" level to the "H" level while the internal WE control circuit 6 is performing the write operation, the write operation is terminated. Therefore, the configuration is made such that if the internal circuit once starts the write operation, an internal write enable signal INWE1 with preset width is generated to hold the write operation for a preset period of time.

By using the above configuration, the user can freely perform the write operation even with an asynchronous type device.

[Fourth Embodiment]

Figure 20:
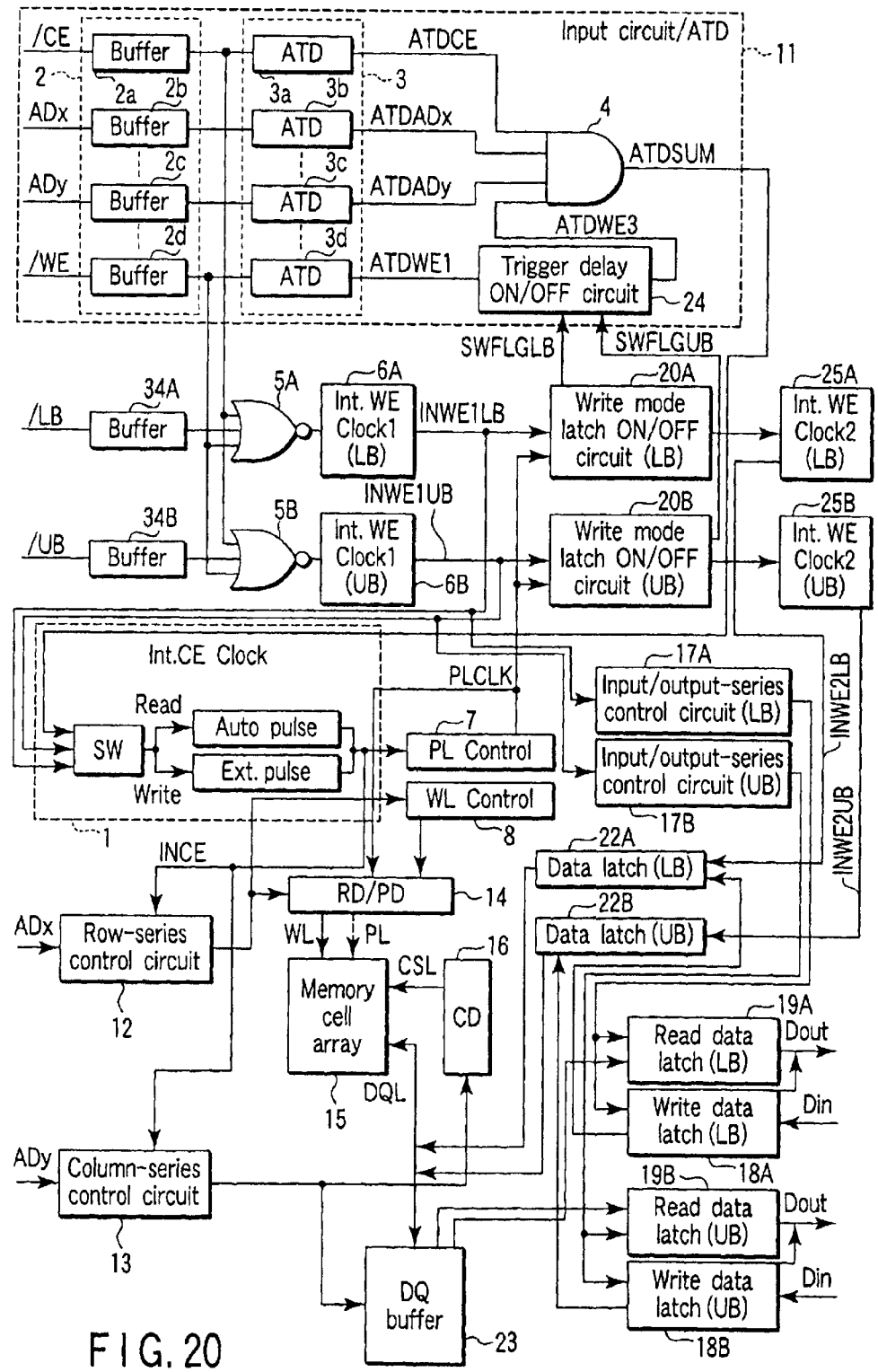
FIG. 20 is a block diagram showing an example of the detail configuration of the extracted main portion of a pseudo-SRAM, for illustrating a semiconductor integrated circuit device according to a fourth embodiment of the present invention.

FIG. 20 is a block diagram for illustrating a semiconductor integrated circuit device according to a fourth embodiment of the present invention. In the present embodiment, the configuration is made to perform a byte control operation. For example, in the case of a semiconductor memory device of 16-bit configuration, the byte control operation is to separate bits into lower eight bits (LB) and upper eight bits (UB) and read and write data for each group of the lower bits or upper bits. For example, the byte control operation can be used when a product with 16-bit configuration is used as a product with 8-bit configuration or the lower bits and upper bits are separately read or written.

In order to perform the byte control operation, in the fourth embodiment, two systems each including part of the circuit associated with the byte control operation in the third embodiment are provided for the lower bits (LB) and upper bits (UB).

In FIG. 20, portions which are the same as those of FIG. 13 are denoted by the same reference numerals, "A" is attached to the ends of the respective reference symbols used in FIG. 13 to indicate portions for the lower bits and "B" is attached to the ends of the respective reference symbols to indicate portions for the upper bits.

The operation of the circuit shown in FIG. 20 is basically the same as that of the circuit shown in FIG. 13 except that the read and write operations are performed for each group of the lower bits or upper bits, and therefore, the detail explanation thereof is omitted.

[Fifth Embodiment]

FIG. 21 is a timing chart for illustrating a semiconductor integrated circuit device according to a fifth embodiment of the present invention. In the fifth embodiment, the configuration is made such that the plate line PL and word line WL may be driven again to write data in the present cycle if the write operation is started with extremely long delay, for example, if it is started after the end of pulse driving of the plate line PL.

It takes a long time to drive the plate line PL and word line WL again, but the cycle time can be reduced in comparison with that in the method for writing data after the next cycle occurs as in the case of the third and fourth embodiments.

Like the first to fourth embodiments, in the fifth embodiment, the user can freely perform the write operation even with an asynchronous type device. However, if the operation is set into the write mode in a short period of time, there occurs a possibility that data once written (or rewritten) may be destroyed, a sufficiently long write time cannot be attained, and as a result, data cannot be perfectly written into a cell. Therefore, in this case, since data destruction may occur, it is necessary to apply the above method to a device which is not set into the write mode in a short period of time.

[Sixth Embodiment]

In the semiconductor integrated circuit device according to the first to fifth embodiments, the pseudo-SRAM using the ferroelectric cell array in which the ferroelectric cells MC1 with the one-transistor/one-capacitor structure are independently connected to corresponding ones of the bit lines BL and plate lines PL in the memory core section is explained. However, the invention can be applied to a pseudo-SRAM using an array in which series connected TC unit type ferroelectric cells are each used as one unit and connected to corresponding ones of the bit lines BL and plate lines PL in the memory core section. The series connected TC unit type ferroelectric memory is a memory which consists of series connected memory cells each having a transistor (T) having a source terminal and a drain terminal and a ferroelectric capacitor (C) in between the two terminals.

Figure 22A:
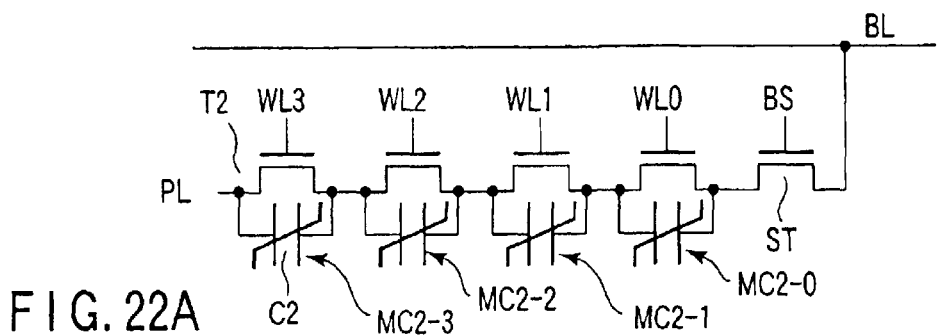
FIG. 22A is an equivalent circuit diagram of a series connected TC unit type ferroelectric cell of one unit, for illustrating a semiconductor integrated circuit device according to a sixth embodiment of the present invention.
Figure 22B:
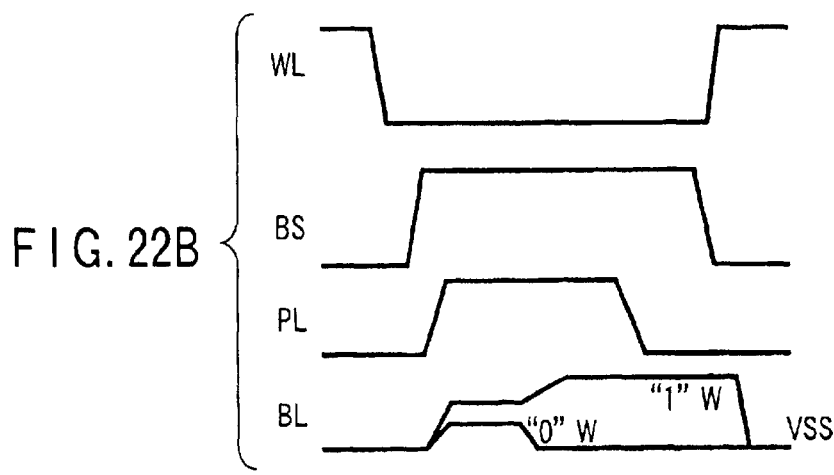
FIG. 22B is a timing chart showing the operation waveforms of the semiconductor integrated circuit device, for illustrating the semiconductor integrated circuit device according to the sixth embodiment of the present invention.

FIGS. 22A and 22B are an equivalent circuit diagram of a series connected TC unit type ferroelectric cell of one unit and a timing chart showing the operation waveforms thereof. The series connected TC unit type ferroelectric cell of one unit shown in FIG. 22A includes a plurality of (in this example, four) ferroelectric cells MC2-0 to MC2-3 and one unit selection transistor ST whose current paths are connected in series between the bit line BL and the plate line PL. Each of the ferroelectric cells MC2-0 to MC2-3 is formed by connecting the current path of a cell transistor T2 and a ferroelectric capacitor C2 in parallel. The gates of the cell transistors T2 of the ferroelectric cells MC2-0 to MC2-3 are respectively connected to word lines WL0 to WL3 and the gate of the unit selection transistor ST is connected to a unit selection line BS.

The word lines WL0 to WL3 except the word line corresponding to the selected ferroelectric cell are set at the "H" level and the cell transistors corresponding to the above word lines are controlled and set into the ON state. As shown in the timing chart of FIG. 22B, only one word line (WL) corresponding to the selected ferroelectric cell is set to the "L" level and the cell transistor corresponding to the word line is controlled and set into the OFF state. In this state, if the unit selection line BS is set to the "H" level, the unit selection transistor ST is set into the ON state. As a result, one of the electrodes of the cell capacitor of the selected ferroelectric cell is connected to the bit line BL and the other electrode thereof is connected to the plate line PL. When the plate line PL is pulse-driven, the potential of the bit line BL changes according to the polarization state of the cell capacitor of the selected ferroelectric cell and thus data of "0" or "1" is read out.

The above configuration is basically the same as that of the pseudo-SRAM having the ferroelectric cells MC1 of the one-transistor/one-capacitor structure arranged in the memory core section and substantially the same operation and effect can be attained.

[Seventh Embodiment]

In the semiconductor integrated circuit device according to the first to sixth embodiments, as shown in FIGS. 5A and 22A, the pseudo-SRAM using the ferroelectric cells MC1, MC2 in which the potential of the plate line PL is pulse-driven in the memory core section is explained.

In the seventh embodiment, DRAM cells with the one-transistor/one-capacitor structure are used in the memory core section.

Figure 23A:
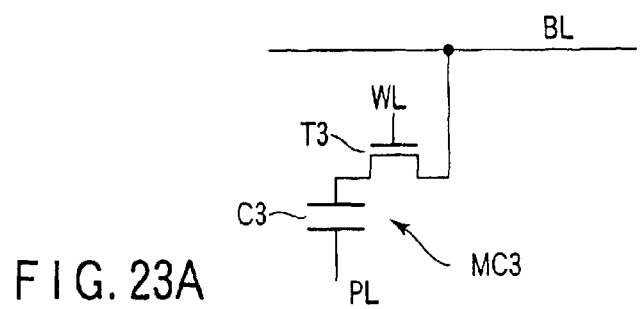
FIG. 23A is an equivalent circuit diagram of a DRAM cell, for illustrating a semiconductor integrated circuit device according to a seventh embodiment of the present invention.

That is, DRAM cells MC3 each having the one-transistor/one-capacitor structure as shown in FIG. 23A are arranged in a matrix form in the memory cell array 15. One end of the current path of a cell transistor T3 is connected to the bit line BL and the other end thereof is connected to one of the electrodes of a cell capacitor C3. The other electrode of the cell capacitor C3 is connected to the plate line PL.

Figure 23B:
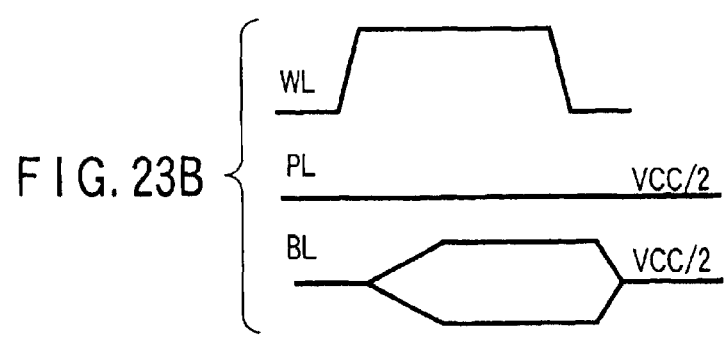
FIG. 23B is a timing chart showing the operation waveforms of the semiconductor integrated circuit device, for illustrating the semiconductor integrated circuit device according to the seventh embodiment of the present invention.

As shown in FIG. 23B, a word line WL is selected while the precharge voltage of the bit line BL and the potential of the plate line PL are kept set at a level which is equal to half the power supply voltage VCC. As a result, the potential of the bit line BL is changed from VCC/2 to the "H" level or "L" level according to the charge stored in the capacitor C3 so as to read out stored data.

The above configuration is basically the same as that of the pseudo-SRAM having the ferroelectric cells MC1, MC2 arranged in the memory core section as explained in the first to fifth embodiments and substantially the same operation and effect can be attained.

As described above, according to one aspect of the present invention, the asynchronous operation which cannot be coped with in the conventional case can be performed. Further, the restrictions on the write operation which are conventionally required can be removed, the free write operation can be coped with and the operability by the user can be enhanced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
a memory cell array;
a chip enable transition detecting circuit which detects transition of a chip enable signal which specifies start of an operation of the memory cell array;
an address transition detecting circuit which detects transition of a row address signal which specifies a row address of the memory cell array and transition of a column address signal which specifies a column address thereof;
a write enable transition detecting circuit which detects transition of a write enable signal which specifies a write operation of the memory cell array;
a first logic circuit which derives a logical product of results of detection by the chip enable transition detecting circuit, the address transition detecting circuit, and the write enable transition detecting circuit;
a second logic circuit which outputs a signal to start the write operation based on the chip enable signal and the write enable signal;
a first internal control circuit which is controlled by an output signal of the first logic circuit to generate an internal chip enable signal;
a second internal control circuit which is controlled by an output signal of the second logic circuit to generate an internal write enable signal;
a plate-line control circuit, into which the internal chip enable signal generated by the first internal control circuit is input;
a word-line control circuit, into which the internal chip enable signal generated by the first internal control circuit is input;
a first read/write control and selection circuit, into which an output signal of the plate-line control circuit is input, which is controlled by the internal write enable signal output from the second internal control circuit and which drives plate lines, the first read/write control and selection circuit including (i) a first timeout circuit which generates a first internal circuit control signal with preset width to control access to the memory cell array based on the internal write enable signal, and (ii) a first pulse generator which outputs a first pulse signal in response to the transition of the write enable signal input from the exterior at the time of the write operation based on the internal write enable signal; and
a second read/write control and selection circuit, into which an output signal of the word-line control circuit is input, which is controlled by the internal write enable signal output from the second internal control circuit and which drives word lines, the second read/write control and selection circuit including (i) a second timeout circuit which generates a second internal circuit control signal with preset width to control access to the memory cell array based on the internal write enable signal and (ii) a second pulse generator which outputs a second pulse signal in response to the transition of the write enable signal at the time of the write operation, based on the internal write enable signal, wherein the operation of the memory cell array is controlled by use of the first and second timeout circuits at the time of the read operation with respect to the memory cell array, the operation of the memory cell array is controlled by use of the first and second timeout circuits when transition of an end of the write enable signal is detected by the write enable transition detecting circuit before a timing specified by the first and second timeout circuits is terminated at the time of the write operation with respect to the memory cell array, and the operation of the memory cell array is controlled by control by the first and second pulse generators when transition of the end of the write enable signal is detected by the write enable transition detecting circuit after the timing specified by the first and second timeout circuits has elapsed at the time of the write operation with respect to the memory cell array.

2. The semiconductor integrated circuit device according to claim 1, further comprising a write delay circuit which delays start of an write operation until it becomes possible to perform the write operation with respect to the memory cell array in a next cycle when the start of the write operation is specified from the exterior in a period in which the write operation with respect to the memory cell array is inhibited.

3. The semiconductor integrated circuit device according to claim 1, further comprising a first circuit which automatically starts a next cycle after the end of the present cycle when start of a write operation is specified from the exterior in a period in which the write operation with respect to the memory cell array is inhibited.

4. The semiconductor integrated circuit device according to claim 1, which further comprises a second circuit which latches write data input from the exterior in a period in which the write operation with respect to the memory cell array is inhibited when start of the write operation is specified from the exterior in the period in which the write operation is inhibited, and a third circuit which extends a period of a write mode until it becomes possible to perform the write operation in a next cycle and in which data latched in the period in which the write operation is inhibited is written into the memory cell array after it becomes possible to perform the write operation of the data in a next cycle.

5. The semiconductor integrated circuit device according to claim 3, which further comprises a second circuit which latches write data input from the exterior in a period in which the write operation with respect to the memory cell array is inhibited when start of the write operation is specified from the exterior in the period in which the write operation is inhibited, and a third circuit which extends a period of a write mode until it becomes possible to perform the write operation in a next cycle and in which data latched in the period in which the write operation is inhibited is written into the memory cell array after it becomes possible to perform the write operation of the data in a next cycle.

6. The semiconductor integrated circuit device according to claim 1, which further comprises two systems for lower and upper bits each including a second circuit which latches write data input from the exterior in a period in which the write operation with respect to the memory cell array is inhibited when start of the write operation is specified from the exterior in the period in which the write operation is inhibited, and a third circuit which extends a period of a write mode until it becomes possible to perform the write operation in a next cycle and in which data is treated in units of the lower bits and upper bits and data latched in the period in which the write operation is inhibited is written into the memory cell array after it becomes possible to perform the write operation of the data in a next cycle.

7. The semiconductor integrated circuit device according to claim 3, which further comprises two systems for lower and upper bits each including a second circuit which latches write data input from the exterior in a period in which the write operation with respect to the memory cell array is inhibited when start of the write operation is specified from the exterior in the period in which the write operation is inhibited, and a third circuit which extends a period of a write mode until it becomes possible to perform the write operation in a next cycle and in which data is treated in units of the lower bits and upper bits and data latched in the period in which the write operation is inhibited is written into the memory cell array after it becomes possible to perform the write operation of the data in a next cycle.

8. The semiconductor integrated circuit device according to claim 1, wherein the memory cell array is set into a write possible state by the control circuit in response to transition of the write enable signal detected by the write enable transition detecting circuit when start of a write operation with respect to the memory cell array is specified from the exterior in a period in which the write operation is inhibited, and then, the write operation is performed in the present cycle.

9. The semiconductor integrated circuit device according to claim 2, wherein the period in which the write operation with respect to the memory cell array is inhibited occurs after a precharge operation of one of the word lines and plate lines has been started.

10. The semiconductor integrated circuit device according to claim 3, wherein the period in which the write operation with respect to the memory cell array is inhibited occurs after a precharge operation of one of the word lines and plate lines has been started.

11. The semiconductor integrated circuit device according to claim 1, wherein the memory cell array is configured by ferroelectric cells arranged in a matrix form.

12. The semiconductor integrated circuit device according to claim 1, wherein the memory cell array is configured by series connected TC unit ferroelectric cells arranged in a matrix form, the TC unit ferroelectric cells each having a transistor (T) having a source terminal and a drain terminal and a ferroelectric capacitor (C) disposed between the two terminals.

13. The semiconductor integrated circuit device according to claim 1, wherein the memory cell array is configured by dynamic cells arranged in a matrix form.

14. A semiconductor integrated circuit device comprising:
a memory cell array;
a chip enable transition detecting circuit which detects transition of a chip enable signal which specifies start of an operation of the memory cell array,
an address transition detecting circuit which detects transition of a row address signal which specifies a row address of the memory cell array and transition of a column address signal which specifies a column address thereof;

a write enable transition detecting circuit which detects transition of a write enable signal which specifies a write operation of the memory cell array;

a first logic circuit which derives a logical product of results of detection by the chip enable transition detecting circuit, the address transition detecting circuit, and the write enable transition detecting circuit;

a second logic circuit which outputs a signal to start the write operation based on the chip enable signal and the write enable signal;

a first internal control circuit which is controlled by an output signal of the second logic circuit to generate an internal chip enable signal;

a second internal control circuit, which is supplied with an internal write enable signal generated in the first internal control circuit and an output signal of the first logic circuit, and which generates an internal chip enable signal, the second internal control circuit including (i) a switch which selects either one of the internal write enable signal and the output signal of the first logic circuit, (ii) a timeout circuit which outputs a pulse signal with preset width from the signal selected by the switch, and (iii) a pulse generator which generates a pulse signal in response to the transition of the write enable signal selected from the signal selected by the switch at the time of the write operation;

a plate-line control circuit, into which the internal chip enable signal output from the second internal control circuit is input, and which drives plate lines; and a word-line control circuit, into which the internal chip enable signal output from the second internal control circuit is input, and which drives word lines;

wherein the operation of the memory cell array is controlled by use of the timeout circuit at the time of the read operation with respect to the memory cell array, the operation of the memory cell array is controlled by use of the timeout circuit when transition of an end of the write enable signal is detected by the write enable transition detecting circuit before a timing specified by the timeout circuit is terminated at the time of the write operation with respect to the memory cell array, and the operation of the memory cell array is controlled by the pulse generator when transition of the end of the write enable signal is detected by the write enable transition detecting circuit after the timing specified by the timeout circuit has elapsed at the time of the write operation with respect to the memory cell array.

15. The semiconductor integrated circuit device according to claim 14, further comprising a write delay circuit which delays start of an write operation until it becomes possible to perform the write operation with respect to the memory cell array in a next cycle when the start of the write operation is specified from the exterior in a period in which the write operation with respect to the memory cell array is inhibited.

16. The semiconductor integrated circuit device according to claim 14, further comprising a first circuit which automatically starts a next cycle after the end of the present cycle when start of a write operation is specified from the exterior in a period in which the write operation with respect to the memory cell array is inhibited.

17. The semiconductor integrated circuit device according to claim 14, which further comprises a second circuit which latches write data input from the exterior in a period in which the write operation with respect to the memory cell array is inhibited when start of the write operation is specified from the exterior in the period in which the write operation is inhibited, and a third circuit which extends a period of a write mode until it becomes possible to perform the write operation in a next cycle and in which data latched in the period in which the write operation is inhibited is written into the memory cell array after it becomes possible to perform the write operation of the data in a next cycle.

18. The semiconductor integrated circuit device according to claim 16, which further comprises a second circuit which latches write data input from the exterior in a period in which the write operation with respect to the memory cell array is inhibited when start of the write operation is specified from the exterior in the period in which the write operation is inhibited, and a third circuit which extends a period of a write mode until it becomes possible to perform the write operation in a next cycle and in which data latched in the period in which the write operation is inhibited is written into the memory cell array after it becomes possible to perform the write operation of the data in a next cycle.

19. The semiconductor integrated circuit device according to claim 14, which further comprises two systems for lower and upper bits each including a second circuit which latches write data input from the exterior in a period in which the write operation with respect to the memory cell array is inhibited when start of the write operation is specified from the exterior in the period in which the write operation is inhibited, and a third circuit which extends a period of a write mode until it becomes possible to perform the write operation in a next cycle and in which data is treated in units of the lower bits and upper bits and data latched in the period in which the write operation is inhibited is written into the memory cell array after it becomes possible to perform the write operation of the data in a next cycle.

20. The semiconductor integrated circuit device according to claim 16, which further comprises two systems for lower and upper bits each including a second circuit which latches write data input from the exterior in a period in which the write operation with respect to the memory cell array is inhibited when start of the write operation is specified from the exterior in the period in which the write operation is inhibited, and a third circuit which extends a period of a write mode until it becomes possible to perform the write operation in a next cycle and in which data is treated in units of the lower bits and upper bits and data latched in the period in which the write operation is inhibited is written into the memory cell array after it becomes possible to perform the write operation of the data in a next cycle.

21. The semiconductor integrated circuit device according to claim 14, wherein the memory cell array is set into a write possible state by the control circuit in response to transition of the write enable signal detected by the write enable transition detecting circuit when start of a write operation with respect to the memory cell array is specified from the exterior in a period in which the write operation is inhibited, and then, the write operation is performed in the present cycle.

22. The semiconductor integrated circuit device according to claim 15, wherein the period in which the write operation with respect to the memory cell array is inhibited occurs after a precharge operation of one of the word lines and plate lines has been started.

23. The semiconductor integrated circuit device according to claim 16, wherein the period in which the write operation with respect to the memory cell array is inhibited occurs after a precharge operation of one of the word lines and plate lines has been started.

24. The semiconductor integrated circuit device according to claim 14, wherein the memory cell array is configured by ferroelectric cells arranged in a matrix form.

25. The semiconductor integrated circuit device according to claim 14, wherein the memory cell array is configured by series connected TC unit ferroelectric cells arranged in a matrix form, the TC unit ferroelectric cells each having a transistor (T) having a source terminal and a drain terminal and a ferroelectric capacitor (C) disposed between the two terminals.

26. The semiconductor integrated circuit device according to claim 14, wherein the memory cell array is configured by dynamic cells arranged in a matrix form.

* * * * *